US012408417B2

(12) United States Patent
Malinowski et al.

(10) Patent No.: US 12,408,417 B2
(45) Date of Patent: Sep. 2, 2025

(54) FORKSHEET SEMICONDUCTOR STRUCTURE INCLUDING AT LEAST ONE BIPOLAR JUNCTION TRANSISTOR AND METHOD

(71) Applicant: GlobalFoundries U.S. Inc., Malta, NY (US)

(72) Inventors: Arkadiusz Malinowski, Dresden (DE); Alexander M. Derrickson, Saratoga Springs, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 643 days.

(21) Appl. No.: 17/807,899

(22) Filed: Jun. 21, 2022

(65) Prior Publication Data
US 2023/0275083 A1    Aug. 31, 2023

Related U.S. Application Data

(60) Provisional application No. 63/314,797, filed on Feb. 28, 2022.

(51) Int. Cl.
*H10D 84/40* (2025.01)
*H01L 21/02* (2006.01)
(Continued)

(52) U.S. Cl.
CPC ..... *H10D 84/401* (2025.01); *H01L 21/02532* (2013.01); *H01L 21/02603* (2013.01);
(Continued)

(58) Field of Classification Search
CPC .... H10D 10/01; H10D 10/021; H10D 10/231; H10D 10/061; H10D 10/60;
(Continued)

(56) References Cited

U.S. PATENT DOCUMENTS 9,847,408 B1 *  12/2017  Jain ............... H10D 10/891
9,991,254 B1 *  6/2018   Cheng ........... H10D 84/0109
(Continued)

OTHER PUBLICATIONS

IMEC, "IMEC's Forksheet Detailed at VLSI-21 A Rapid Successor to Nanosheet?", 2021, pp. 1-8.

*Primary Examiner* — Wael M Fahmy
*Assistant Examiner* — Quinton A Brasfield
(74) *Attorney, Agent, or Firm* — Francois Pagette; Hoffman Warnick LLC

(57) ABSTRACT

Disclosed are a forksheet semiconductor structure and a method of forming the structure. The structure can include a dielectric body with a first sidewall and a second sidewall opposite the first sidewall. The structure can include a first transistor, which incorporates first semiconductor nanosheet(s) positioned laterally immediately adjacent to the first sidewall of the dielectric body, and a second transistor, which incorporates second semiconductor nanosheet(s) positioned laterally immediately adjacent to the second sidewall. The first transistor and the second transistor can both be bipolar junction transistors (BJTs) (e.g., PNP-type BJTs, NPN-type BJTs or a PNP-type BJT and an NPN-type BJT). Alternatively, the first transistor can be a BJT (e.g., a PNP-type BJT or an NPN-type BJT) and the second transistor can be a field effect transistor (FET) (e.g., an N-type FET (NFET) or a P-type FET (PFET)).

20 Claims, 35 Drawing Sheets

(51) Int. Cl.
*H10D 10/01* (2025.01)
*H10D 10/60* (2025.01)
*H10D 30/01* (2025.01)
*H10D 30/43* (2025.01)
*H10D 30/67* (2025.01)
*H10D 62/10* (2025.01)
*H10D 84/01* (2025.01)
*H10D 84/03* (2025.01)

(52) U.S. Cl.
CPC ........... *H10D 10/061* (2025.01); *H10D 10/60* (2025.01); *H10D 30/014* (2025.01); *H10D 30/031* (2025.01); *H10D 30/43* (2025.01); *H10D 30/6735* (2025.01); *H10D 30/6757* (2025.01); *H10D 62/121* (2025.01); *H10D 84/0109* (2025.01); *H10D 84/038* (2025.01)

(58) Field of Classification Search
CPC .. H10D 84/401; H10D 84/409; H10D 84/619; H10D 84/645; H10D 84/0112; H10D 84/0119; H10D 62/134; H10D 62/184; H10D 30/501; H10D 30/507–509; H10D 30/6735; H10D 62/177–184; H01L 21/02603
See application file for complete search history.

(56) References Cited

U.S. PATENT DOCUMENTS

| | | |
|---|---|---|
| 11,239,236 B2 | 2/2022 | Lilak et al. |
| 2017/0243782 A1* | 8/2017 | Wu ................... H10D 30/6757 |
| 2020/0035786 A1* | 1/2020 | Xie ................... H10D 30/6744 |
| 2021/0183711 A1 | 6/2021 | Dentoni Litta et al. |
| 2021/0193821 A1 | 6/2021 | Dentoni Litta et al. |
| 2021/0407999 A1 | 12/2021 | Huang et al. |

* cited by examiner

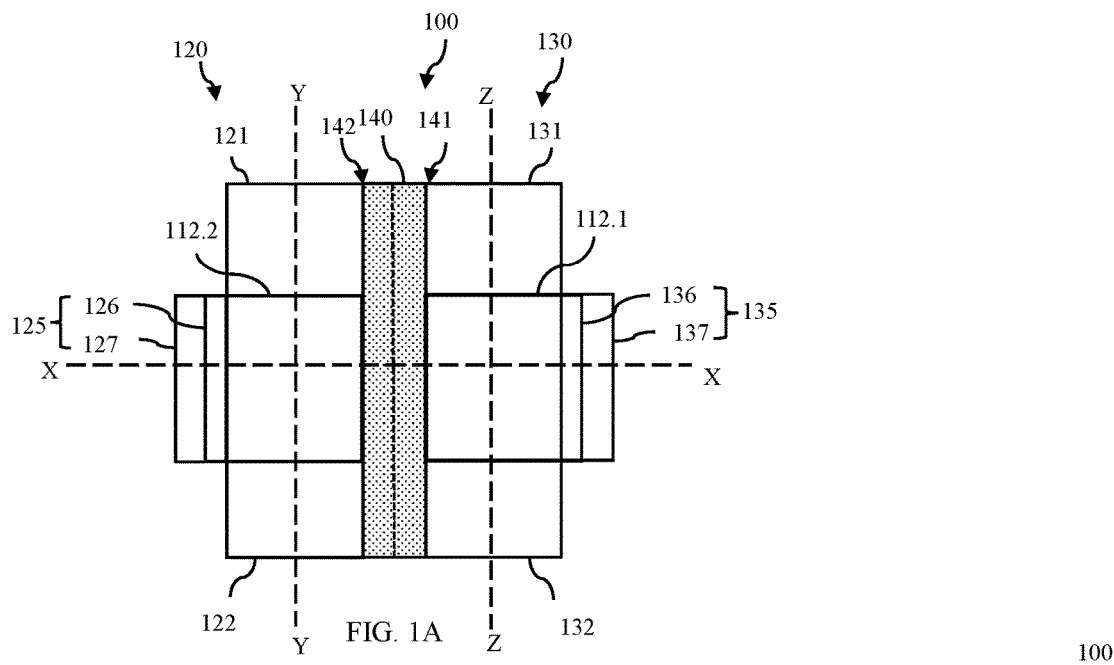
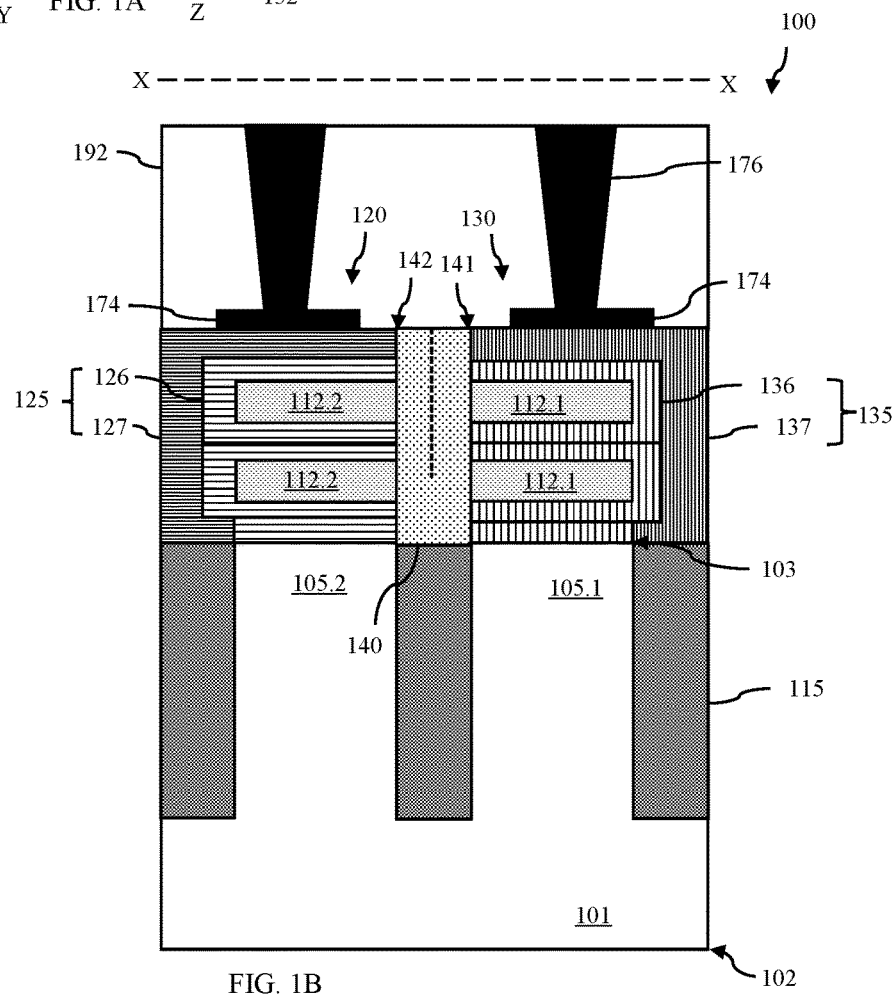
FIG. 1A
FIG. 1B

FORKSHEET SEMICONDUCTOR STRUCTURE INCLUDING AT LEAST ONE BIPOLAR JUNCTION TRANSISTOR AND METHOD

BACKGROUND

Field of the Invention

The present invention relates to transistors and, more particularly, to embodiments of a forksheet semiconductor structure including at least one bipolar junction transistor (BJT) and a method of forming the forksheet semiconductor structure.

Description of Related Art

Key factors considered in modern integrated circuit design include, but are not limited to, performance improvement, size scaling, and power consumption. Recently, a complementary metal oxide semiconductor (CMOS) device structure (referred to herein as a CMOS forksheet semiconductor structure) has been developed that allows for a reduction in the minimum spacing between a pair of field effect transistor (FETs) and, thus, allows for size scaling. This CMOS forksheet semiconductor structure also exhibits reduced power consumption and improved performance. Applications that benefit from the size scaling, reduced power consumption, and improved performance associated with FETs in a CMOS forksheet semiconductor structure could also benefit from the inclusion of BJTs because BJTs tend to have more drive and are generally considered better suited for analog functions than FETs.

SUMMARY

Disclosed herein are embodiments of a semiconductor structure. The semiconductor structure can include a dielectric body with a first sidewall and a second sidewall opposite the first sidewall. The semiconductor structure can further include a first transistor and a second transistor. The first transistor can include a first semiconductor nanosheet, which is positioned laterally immediately adjacent to the first sidewall. This first transistor can specifically be a BJT. The second transistor can include a second semiconductor nanosheet, which is positioned laterally immediately adjacent to the second sidewall.

In some of the disclosed embodiments, the first transistor and the second transistor of the semiconductor structure can both be BJTs. Specifically, the semiconductor structure can include a dielectric body with a first sidewall and a second sidewall opposite the first sidewall. The semiconductor structure can further include a first BJT and a second BJT. The first BJT can include a first semiconductor nanosheet, which is positioned laterally immediately adjacent to the first sidewall. The second BJT can include a second semiconductor nanosheet, which is positioned laterally immediately adjacent to the second sidewall. In other disclosed embodiments, as discussed further in the detailed description section, the first transistor can be a BJT and the second transistor can be a FET.

Also disclosed herein are method embodiments for forming these semiconductor structures. The method embodiments can include forming a first transistor and forming a second transistor. The first transistor can be formed so that it includes a first semiconductor nanosheet, which is positioned laterally immediately adjacent to a first sidewall of a dielectric body. The first transistor can specifically be formed so that it is a BJT. The second transistor can be formed so that it includes a second semiconductor nanosheet, which is positioned laterally immediately adjacent to a second sidewall of the dielectric body opposite the first sidewall. In some embodiments, the second transistor can be formed as a second BJT. In other embodiments, the second transistor can be formed as a FET.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 1A is a layout diagram and FIGS. 1B-1D are different cross-section diagrams of a disclosed embodiment of a forksheet semiconductor structure including two BJTs;

DETAILED DESCRIPTION

As mentioned above, recently, a CMOS forksheet semiconductor structure has been developed that allows for a reduction in the minimum spacing between a pair of FETs and, thus, allows for size scaling. This CMOS forksheet semiconductor structure also exhibits reduced power consumption and improved performance. Applications that benefit from the size scaling, reduced power consumption, and improved performance associated with FETs in a CMOS forksheet semiconductor structure could also benefit from the inclusion of BJTs because BJTs tend to have more drive and are generally considered better suited for analog functions than FETs.

In view of the foregoing, disclosed herein are embodiments of a forksheet semiconductor structure and, particularly, either a BJT forksheet semiconductor structure or a hybrid forksheet semiconductor structure. Specifically, in the disclosed embodiments, the forksheet semiconductor structure can include a dielectric body with a first sidewall and a second sidewall opposite the first sidewall. The forksheet semiconductor structure can further include a first transistor and a second transistor. The first transistor can incorporate first semiconductor nanosheet(s) positioned laterally adjacent to the first sidewall of the dielectric body. The second transistor can incorporate second semiconductor nanosheet(s) positioned laterally immediately adjacent to the second sidewall of the dielectric body. In a BJT forksheet semiconductor structure, the first transistor and the second transistor can both be BJTs (e.g., PNP-type BJTs, NPN-type BJTs, or a PNP-type BJT and an NPN-type BJT, respectively). In a hybrid forksheet semiconductor structure, the first transistor can be a BJT (e.g., a PNP-type BJT or an NPN-type BJT) and the second transistor can be a FET (e.g., an N-type FET (NFET) or a P-type FET (PFET)). Such forksheet semiconductor structures can be employed to reduce the minimum spacing between a pair of BJTs (in the BJT forksheet semiconductor structure) or between a BJT and a FET (in the hybrid forksheet semiconductor structure) and can further be employed to reduce power consumption and improve device performance. Also disclosed herein are method embodiments for forming these semiconductor structures.

Figure 1C:
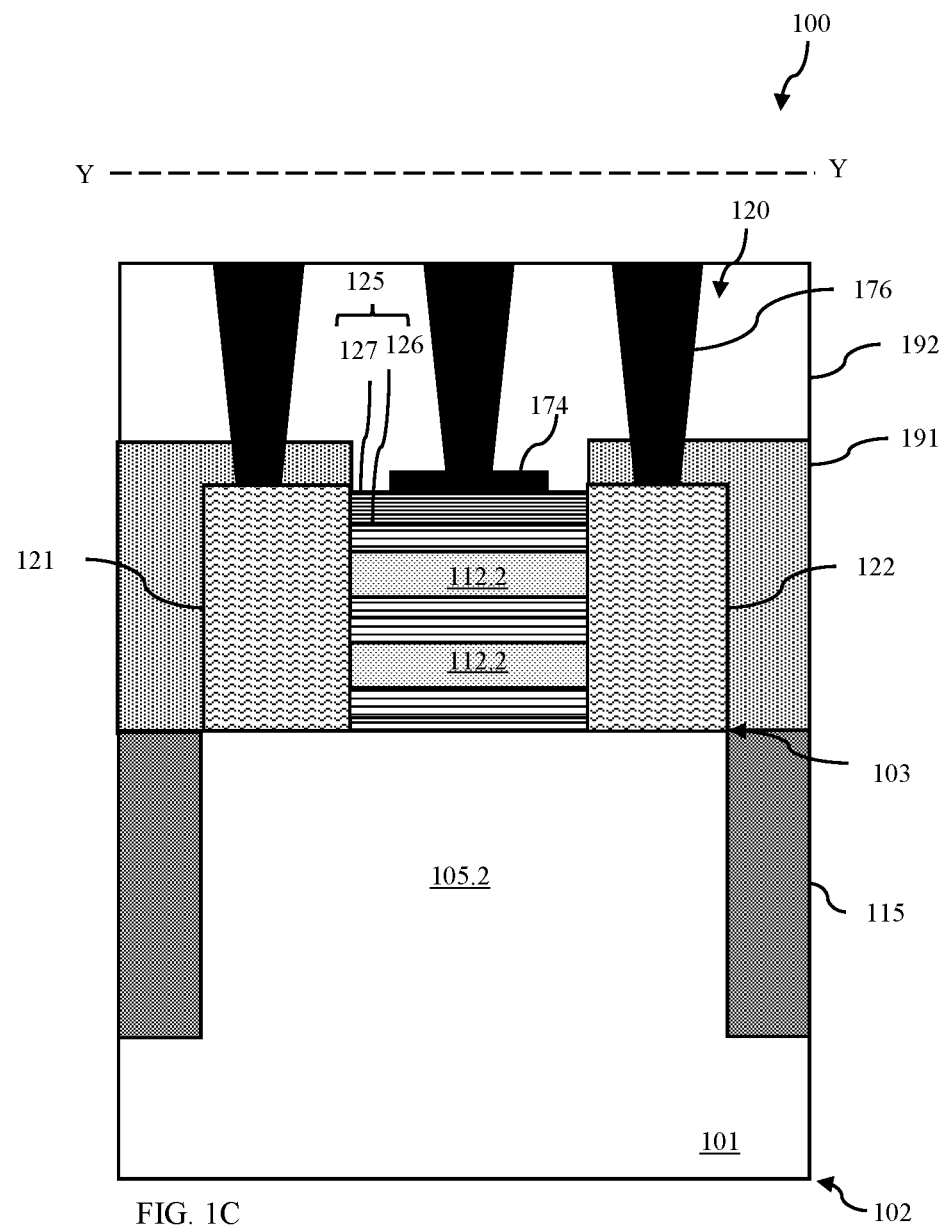
Figure 1D:
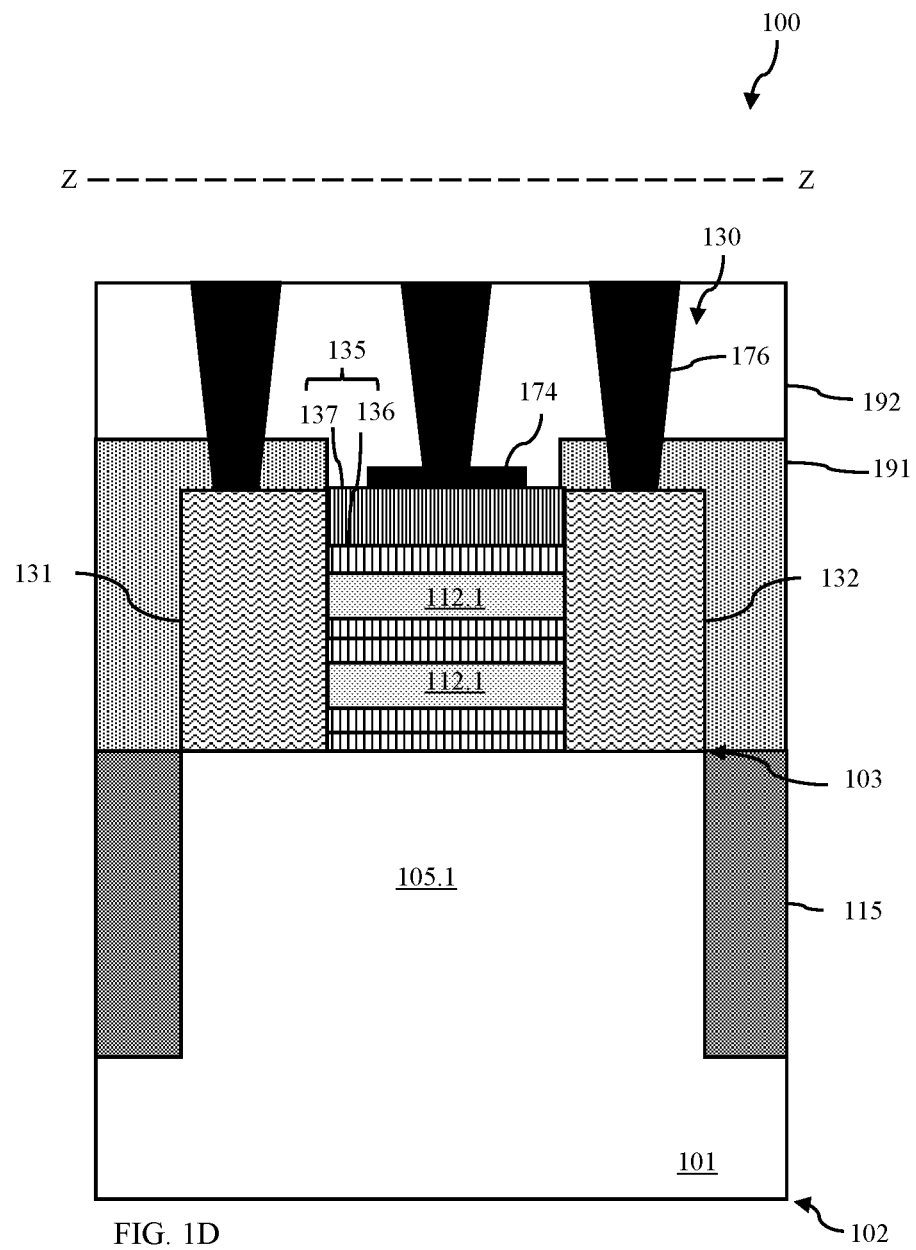
Figure 2A:
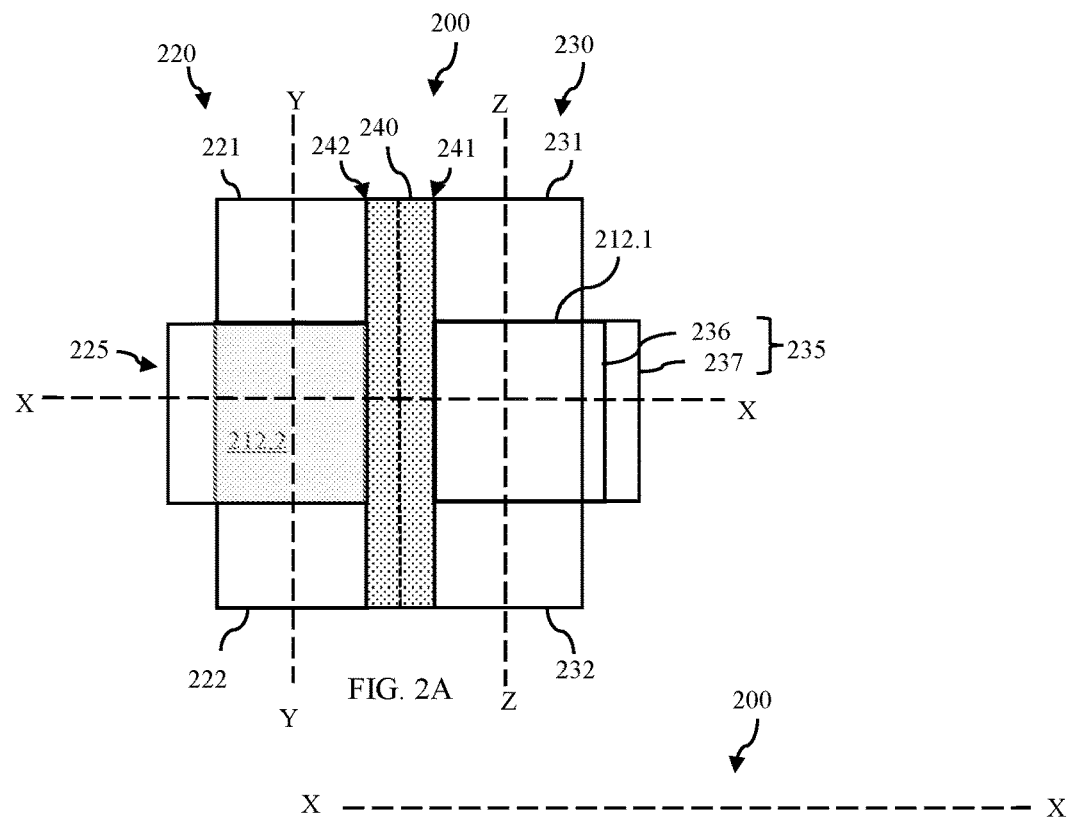
FIG. 2A is a layout diagram and FIGS. 2B-2D are different cross-section diagrams of another disclosed embodiment of a forksheet semiconductor structure including a BJT and a FET.
Figure 2B:
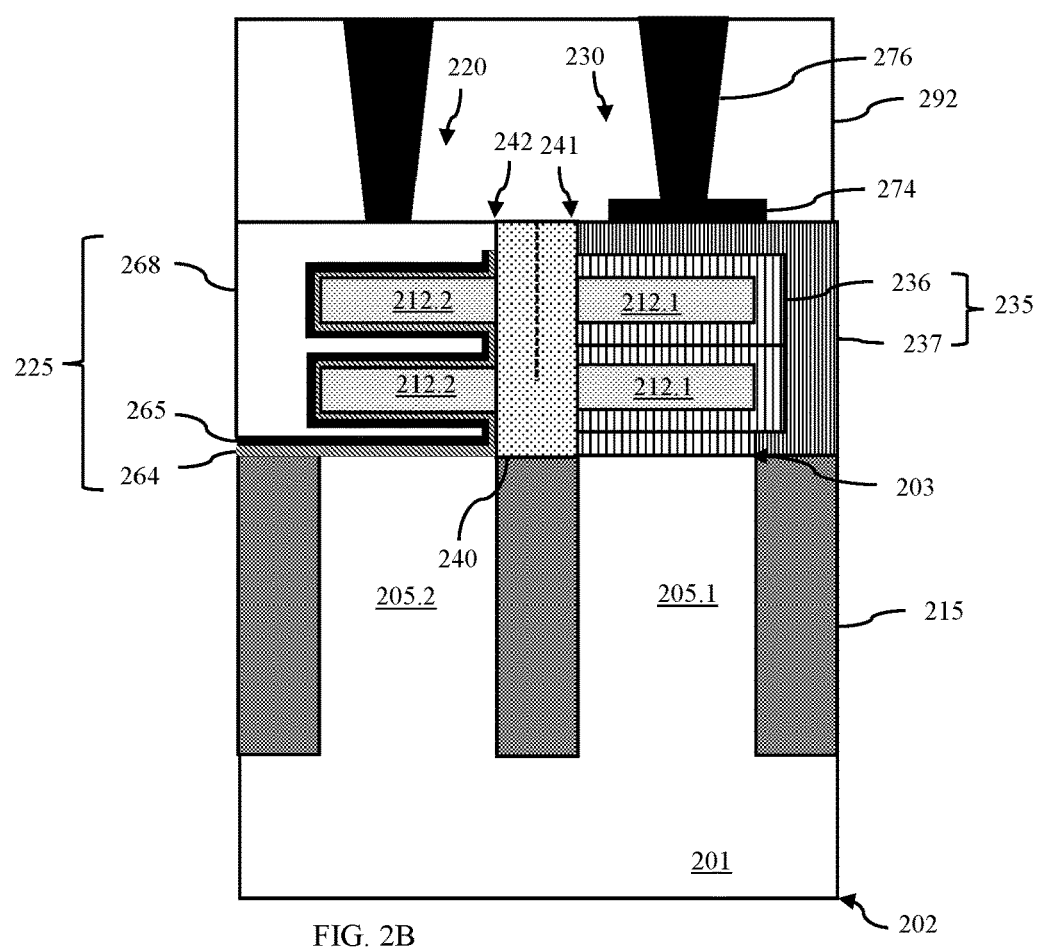
Figure 2C:
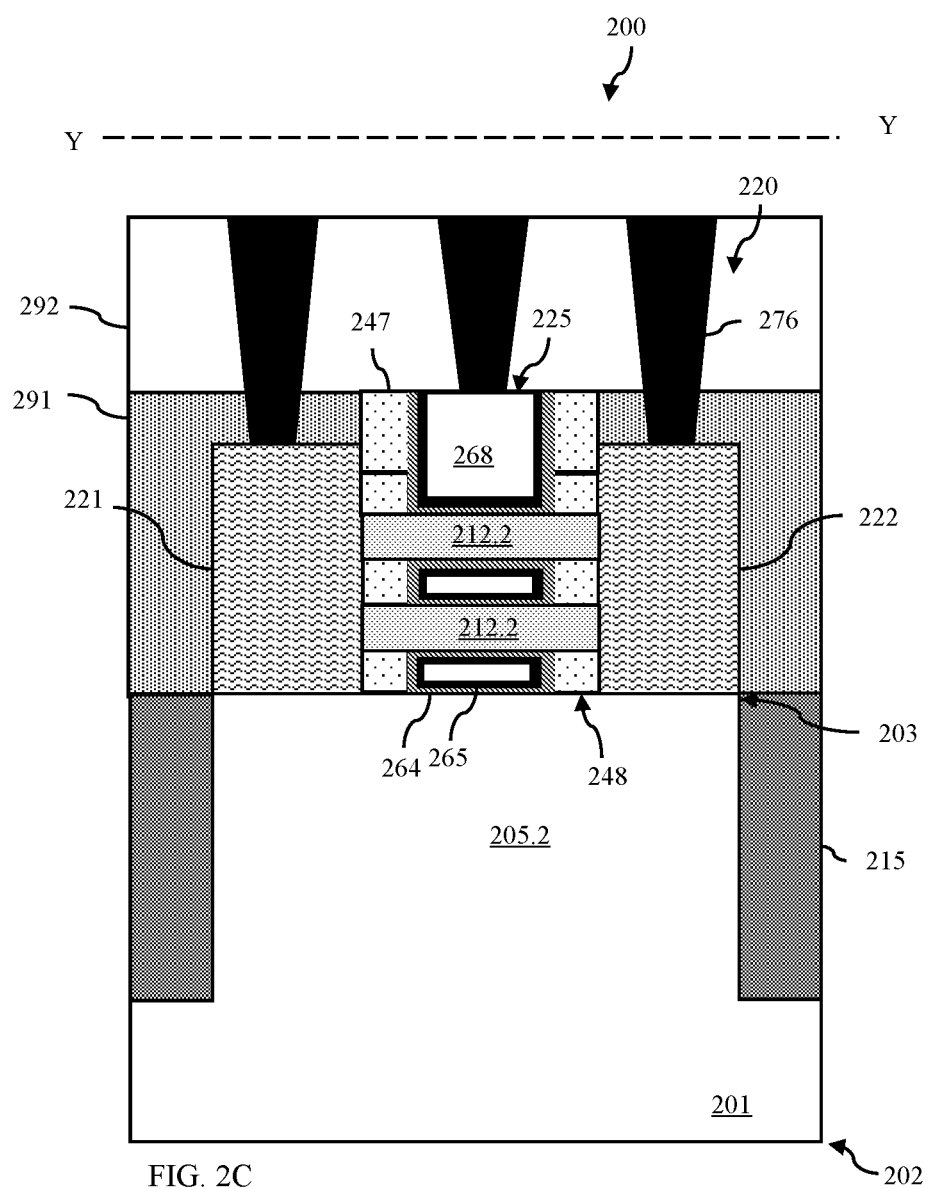
Figure 2D:
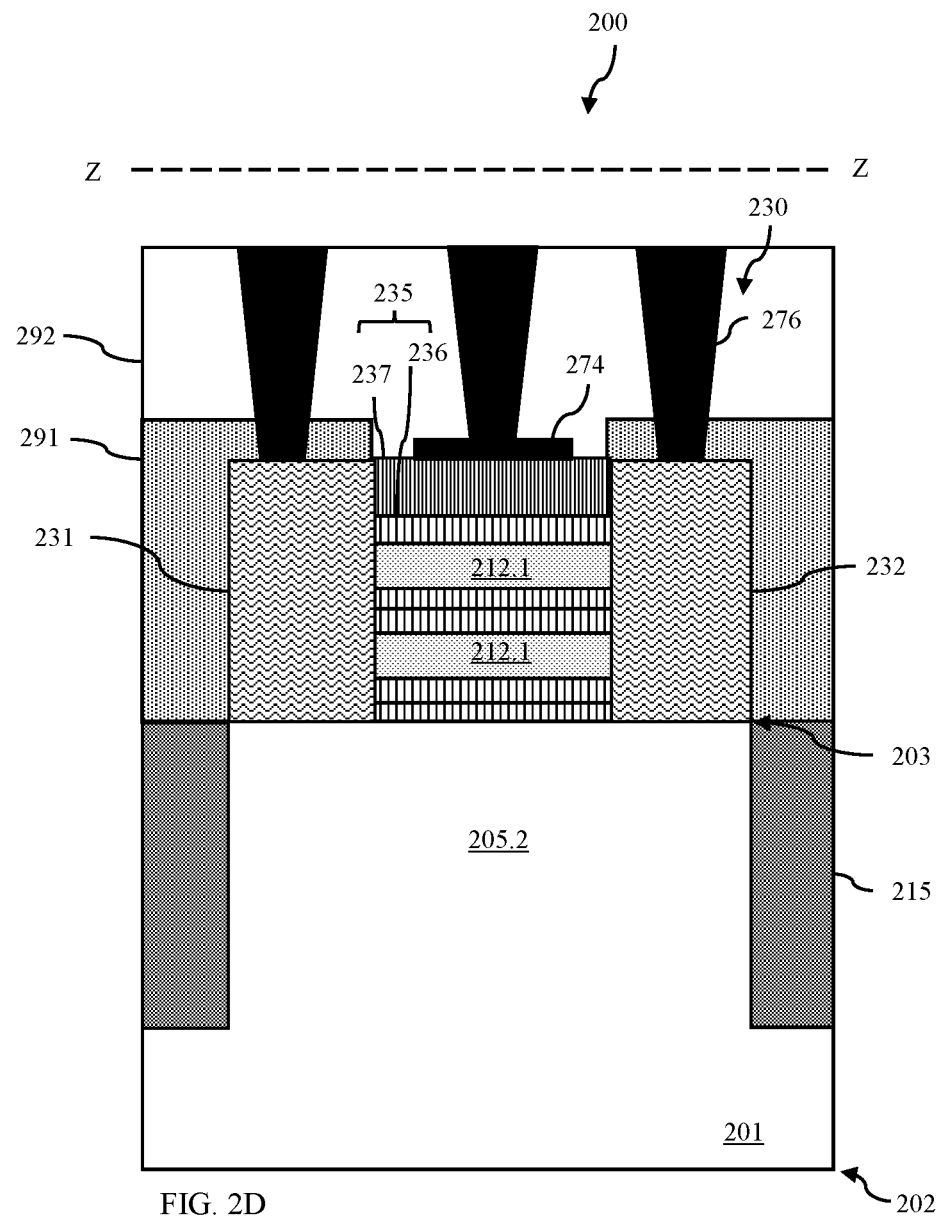

FIG. 1A is a layout diagram and FIGS. 1C-1D are different cross-section diagrams of disclosed embodiments of a forksheet semiconductor structure 100 and, particularly, a BJT forksheet semiconductor structure that includes a first transistor 130 and a second transistor 120 positioned laterally adjacent to opposing sidewalls of a dielectric body 140. In this semiconductor structure 100, the first transistor 130 and the second transistor 120 are both BJTs. FIG. 2A is a layout diagram and FIGS. 2C-2D are different cross-section diagrams of disclosed embodiments of another forksheet semiconductor structure 200 and, particularly, a hybrid forksheet semiconductor structure that similarly includes a first transistor 230 and a second transistor 220 positioned laterally adjacent to opposing sidewalls of a dielectric body 240. However, in this semiconductor structure 200, the first transistor 230 and the transistor 220 are a BJT and a field effect transistor (FET).

It should be noted that in each of the embodiments the first and second transistors are oriented in essentially the same direction and parallel to each other and to the dielectric body therebetween. Additionally, in the figures: all cross-section drawings labeled XX are vertical cross-sections cutting widthwise across the center portions of the first transistor, the second transistor and the dielectric body therebetween (or partially completed structures thereof); all cross-section drawings labeled ZZ are vertical cross-sections cutting lengthwise across the first transistor (or the partially completed structure thereof) in a direction parallel to the dielectric body; and all cross-section drawings labeled YY are vertical cross-sections cutting lengthwise across the second transistor (or the partially completed structure thereof) in a direction parallel to the dielectric body.

Referring to FIGS. 1A-1D and to FIGS. 2A-2D, in each of the disclosed embodiments, the semiconductor structure 100, 200 can include a semiconductor substrate 101, 201. The semiconductor substrate 101, 201 can be, for example, a bulk semiconductor substrate such as a bulk monocrystalline silicon (Si) substrate. The semiconductor substrate 101, 201 can have a first surface 102, 202 (i.e., a bottom surface) and a second surface 103, 203 (i.e., a top surface) opposite the first surface.

The semiconductor structure 100, 200 can further include trench isolation regions 115, 215 (e.g., shallow trench isolation (STI) regions). These trench isolation regions 115, 215 can extend vertically from the second surface 103, 203 toward the first surface 102, 202. The trench isolation regions 115, 215 can define the shapes of and, particularly, laterally surround a pair of essentially parallel semiconductor bodies 105.1-105.2, 205.1-205.2 (i.e., a first semiconductor body 105.1, 205.1 and a second semiconductor body 105.2, 205.2) within the upper portion of the semiconductor substrate 101, 201. The trench isolation regions 115, 215 can trenches and one or more layers of isolation material filling the trenches. The isolation material can include, for example, silicon dioxide (SiO2) or some other suitable isolation material.

The semiconductor structure 100, 200 can further include a dielectric body 140, 240 (also referred to herein as a dielectric wall) aligned vertically above and immediately adjacent to the trench isolation region 115, 215 between first and semiconductor bodies 105.1-105.2, 205.1-205.2. This dielectric body 140, 240 can be essentially rectangular in shape with a bottom surface, a top surface opposite the bottom surface, opposing sidewalls (i.e., a first sidewall 141, 241 and a second sidewall 142, 242 opposite the first sidewall) and opposing end walls. As illustrated, the first sidewall 141, 241 can be aligned vertically with the interface between the first semiconductor body 105.1, 205.1 and the trench isolation region and the second sidewall 142, 242 can be aligned essentially vertically with the interface between the second semiconductor body 105.2, 205.2 and the trench isolation region. The dielectric body 140, 240 can be made, for example, of silicon nitride (SiN) or some suitable dielectric material.

The semiconductor structure 100, 200 can further a first transistor 130, 230, which incorporates one or more first semiconductor nanosheet(s) 112.1, 212.2 positioned laterally immediately adjacent to the first sidewall 141, 241 of the dielectric body 140, 240, and a second transistor 120, 220, which incorporates one or more second semiconductor nanosheet(s) 112.2, 212.2 positioned laterally immediately adjacent to the second sidewall 142, 242 of the dielectric body 140, 240.

For purposes of this disclosure, a semiconductor nanosheet refers to a relatively thin, elongated, essentially rectangular-shaped, semiconductor body oriented essentially parallel to the top surface of the semiconductor substrate 101, 201. Each first semiconductor nanosheet 112.1, 212.1 can have a first bottom surface, a first top surface opposite the first bottom surface, a first proximal side immediately adjacent to the first sidewall 141, 241 of the dielectric body 140, 240, a first distal side opposite the first proximal side, and first opposing ends. Each second semiconductor nanosheet 112.2, 212.2 can have a second bottom surface, a second top surface opposite the second bottom surface, a second proximal side positioned laterally immediately adjacent to the second sidewall 142, 242 of the dielectric body 140, 240, a second distal side opposite the second proximal side, and second opposing ends.

For purposes of illustration, the first transistor 130, 230 is shown as incorporating two first semiconductor nanosheets 112.1, 212.1 and the second transistor 120, 220 is shown as incorporating two second semiconductor nanosheets 112.2, 212.2. However, the figures are not intended to be limiting. Each of the transistors can include any number of one or more semiconductor nanosheets. In any case, the first bottom surface of a single first semiconductor nanosheet or of a lowermost first semiconductor nanosheet in a stack can be above and physically separated from the top surface of the first semiconductor body 105.1, 205.1. Similarly, the second bottom surface of a single second semiconductor nanosheet or of a lowermost second semiconductor nanosheet in a stack can be above and physically separated from the top surface of the second semiconductor body 205.1. Any adjacent semiconductor nanosheets in a stack can be physically separated. Additionally, the first top surface of a single first semiconductor nanosheet or of an uppermost first semiconductor nanosheet in a stack can be below the level of the top of the dielectric body 140, 240. Similarly, the second top surface of a single second semiconductor nanosheet or of an uppermost second semiconductor nanosheet in a stack can be below the level of the top of the dielectric body 140, 240. Additionally, adjacent nanosheets in each stack can be physically separated and the top surfaces of the uppermost semiconductor nanosheets in the stacks can be some distance below the level of the top of the dielectric body 140, 240. The number of first semiconductor nanosheets 112.1, 212.1 in a stack and the number of the second semiconductor nanosheets 112.2, 212.2 in a stack can be the same and each first semiconductor nanosheet 112.1, 212.1 being horizontally aligned with a corresponding second semiconductor nanosheet 112.2, 212.2, as illustrated. Alternatively, the numbers of first and second semiconductor nanosheets can be different and/or not horizontally aligned.

In any case, the first semiconductor nanosheet(s) 112.1, 212.2 and the second semiconductor nanosheet(s) 112.2, 212.2 can be monocrystalline in structure. The semiconductor materials of the first semiconductor nanosheet(s) 112.1, 212.2 and the second semiconductor nanosheet(s)112.2, 212.2 can be the same. For example, the first semiconductor nanosheet(s) 112.1, 212.2 and the second semiconductor nanosheet(s) 112.2, 212.2 can be made of Si. Alternatively, the first semiconductor nanosheet(s) 112.1, 212.2 and the second semiconductor nanosheet(s)112.2, 212.2 could be made of some other suitable semiconductor material (e.g., silicon carbide (SiC), silicon germanium (SiGe), etc.). Alternatively, the first semiconductor nanosheet(s) 112.1, 212.2 and the second semiconductor nanosheet(s)112.2, 212.2 could be made of different semiconductor materials (e.g., Si and SiGe, respectively; Si and SiC, respectively, etc.).

In exemplary embodiments, the first and second semiconductor nanosheets can each have a thickness of 3-10 nm (e.g., approximately 6.5 nm) and a width of less than 30 nm (e.g., approximately 23 nm). The spacings between top surfaces of the first and second semiconductor bodies and bottom surfaces of adjacent first and second semiconductor nanosheets, respectively, can be 5-10 nm (e.g., approximately 8.5). The spacings between adjacent semiconductor nanosheets in a stack on either side of the dielectric body can also be 5-10 nm (e.g., approximately 8.5). The dielectric body 140, 240 can have a width of less than 20 nm (e.g., approximately 16-19 nm) and can be relatively tall such that the top of the dielectric body 140, 240 is at least 25-35 nm (e.g., 30 nm) above the level of the top surfaces of the uppermost first and second semiconductor nanosheets. Thus, for example, in a semiconductor structure 100, 200 that includes two first semiconductor nanosheets 112.1, 212.1 and two second semiconductor nanosheets 112.2, 212.2, with the above-mentioned dimensions and spacings, the dielectric body 140, 240 can have a height of 55-75 nm (e.g., approximately 60 nm, as measured from the top surface of the trench isolation region).

As mentioned above, in the semiconductor structure 100 of FIGS. 1A-1D, the first transistor 130 is a first BJT and the second transistor 120 is a second BJT; whereas, in the semiconductor structure 200 of FIGS. 2A-2D, the first transistor 230 is a BJT and the second transistor is a FET. Optionally, the first BJT 130 and/or the second BJT 120 in the semiconductor structure 100 could be heterojunction bipolar transistor (HBT) Similarly, optionally, the BJT 230 in the semiconductor structure 200 could be an HBT.

Generally, a BJT includes: an emitter region, a collector region, and a base region between the emitter region and the collector region (i.e., between the emitter/collector regions). The base region (or at least a portion thereof) can have a first-type conductivity and the emitter/collector regions can have a second-type conductivity that is different from the first-type conductivity. The first-type conductivity and the second-type conductivity can be P-type conductivity and N-type conductivity or vice versa depending upon the type of BJT. For example, in an NPN-type BJT, the first-type conductivity is P-type and the second-type conductivity is N-type (i.e., the base region or portion thereof has P-type conductivity and the emitter/collector regions have N-type conductivity). In a PNP-type BJT, the first-type conductivity is N-type and the second-type conductivity is P-type (i.e., the base region or portion thereof has N-type conductivity and the emitter/collector regions have P-type conductivity). In a BJT, the same semiconductor material can be used for the base region and for the emitter/collector regions. This semiconductor material can be, for example, Si. In a BJT that is specifically an HBT, the base region can, at least in part, be made of a different semiconductor material that the emitter/collector regions. For example, the emitter/collector regions can be Si and the base region can, at least in part, be SiGe. The use of differing semiconductor materials at the emitter-base junction and at the base-collector junction creates heterojunctions suitable for handling higher frequencies. Also, generally, a FET includes at least one channel region positioned laterally between a source region and a drain region (i.e., between source/drain regions) and a gate structure, which is adjacent to the channel region(s) and electrically isolated from the source/drain regions. The channel regions(s) can have a first-type conductivity (or, alternatively, be intrinsic/undoped) and the source/drain regions can have a second-type conductivity that is different from the first-type conductivity. The first-type conductivity and the second-type conductivity can be P-type conductivity and N-type conductivity or vice versa depending upon the type of FET. For example, in an NFET, the first-type conductivity can be P-type and the second-type conductivity can be N-type. That is, the channel region(s) can have P-type conductivity (or be intrinsic/undoped) and the source/drain regions can have N-type conductivity. In a PFET, the first-type conductivity can be N-type and the second-type conductivity can be P-type. That is, the channel region(s) can have N-type conductivity (or be intrinsic/undoped) and the source/drain regions can have P-type conductivity. See the detailed discussion below regarding different dopants that can be employed in different semiconductor materials to achieve P-type conductivity or N-type conductivity in the semiconductor layers and/or regions incorporated into the disclosed embodiments.

More specifically, in the semiconductor structure embodiments disclosed herein, the first transistor 130, 230 can be a BJT.

This BJT 130, 230 can include a base region 135, 235 including the first semiconductor nanosheet(s) 112.1, 212.1. The first semiconductor nanosheet(s) 112.1, 212.1 can be intrinsic (i.e., undoped) or, alternatively, can have a first-type conductivity at a relatively low conductivity level (e.g., due to dopant diffusion from layers formed thereon). The base region 135, 235 can further include a base semiconductor layer 136, 236. This base semiconductor layer 136, 236 can be a selectively grown epitaxial semiconductor layer on three surfaces of each first semiconductor nanosheet (i.e., on the first top surface, the first bottom surface, and the first distal side). The base semiconductor layer 136, 236 can have the first-type conductivity.

As illustrated, this base semiconductor layer 136, 236 can fill the spaces between the top surface of the first semiconductor body 105.1, 205.1 and the adjacent first semiconductor nanosheet and, if applicable, the spaces between adjacent first semiconductor nanosheets. Thus, the overall width of the base semiconductor layer 136, 236, as measured from the first sidewall 141, 241 of the dielectric body 140, 240 across and parallel to the first semiconductor nanosheet(s) is greater than the width of the first semiconductor nanosheet(s) by a few nms. For example, as mentioned above, in some embodiments, the width of the first semiconductor nanosheets can be approximately 23 nm and spacing below each nanosheet can be approximately 8.5 nm. In these embodiments, the width of the base semiconductor layer 136, 236 can be approximately 4-5 nm greater than the width of the first semiconductor nanosheet(s) (e.g., approximately 27 nm). The base semiconductor layer 136, 236 can be made of the same semiconductor material as the semiconductor nanosheet(s) 112.1, 212.1 (e.g., Si). Alternatively, for a heterojunction bipolar transistor (HBT), this base semiconductor layer 136, 236 can be made of a semiconductor material that is different from that of the semiconductor nanosheets (e.g., SiGe).

The base region 135, 235 can further include an additional base semiconductor layer 137, 237 (also referred to herein as an extrinsic base semiconductor layer). This additional base semiconductor layer 137, 237 can be a selectively grown epitaxial semiconductor layer on exposed surfaces of the base semiconductor layer 136, 236 (e.g., on an essentially horizontal top surface of the base semiconductor layer above all first semiconductor nanosheet(s) and on an essentially vertical outer side surface). The additional base semiconductor layer 137, 237 can have the first-type conductivity at a higher conductivity level than the base semiconductor layer 136, 137. Furthermore, the additional base semiconductor layer 137, 237 can be made of the same semiconductor material as the first semiconductor nanosheet(s) 112.1, 212.1 (e.g., Si), the same semiconductor material as the base semiconductor layer 136, 236, or a layer of some other suitable base semiconductor material.

This BJT 130, 230 can also include emitter/collector regions 131-132, 231-232. The base region 135, 235 can be positioned laterally between and immediately adjacent to the emitter/collector regions 131-132, 231-232. The emitter/collector regions can also each be positioned laterally immediately adjacent to the first sidewall 141, 241 of the dielectric body 140, 240. The emitter/collector regions 131-132, 231-232 can be selectively grown epitaxial semiconductor layers that abut the first opposing ends of the first semiconductor nanosheet(s) 112.1, 212.1, respectively, and that further abuts inner portions of the base semiconductor layer 136, 236 above and below the first semiconductor nanosheet(s) 112.1, 212.1.

This BJT 130, 230 can be either a PNP-type BJT (where the first-type conductivity is N-type and the second-type conductivity is P-type, as discussed above) or an NPN-type BJT (where the first-type conductivity is P-type and the second-type conductivity is N-type, also as discussed above). Thus, if the BJT 130, 230 is a PNP-type BJT, it can include an N-base semiconductor layer 136, 236, an N+ additional base semiconductor layer 137, 237 and P+ emitter/collector regions 131-132, 231-232. If the BJT 130, 230 is an NPN-type BJT, it can include a P-base semiconductor layer 136, 236, a P+ additional base semiconductor layer 137, 237 and N+ emitter/collector regions 131-132, 231-232.

Referring to the semiconductor structure 100 of FIGS. 1A-1D, the second transistor 120 can be a second BJT, which is configured essentially the same as the BJT described above. Specifically, this second BJT 120 can include a second base region 125 positioned laterally between second emitter/collector regions 121-122.

The second base region 125 can further include a second base semiconductor layer 126, which is a selectively grown epitaxial semiconductor layer on the top surface of the second semiconductor body 105.2 and on three surfaces of each second semiconductor nanosheet (i.e., the second top surface, the second bottom surface, and the second distal side). The second base semiconductor layer 126 can fill the spaces between the top surface of the second semiconductor body 105.2 and the adjacent second semiconductor nanosheet and, if applicable, can also fill spaces between adjacent second semiconductor nanosheets. The second base semiconductor layer 126 can be made of the same semiconductor material as the semiconductor nanosheet(s) 112.2 (e.g., Si). If the second BJT 120 is specifically an HBT, this second base semiconductor layer 126 can be made of a semiconductor material that is different from that of the semiconductor nanosheets (e.g., SiGe). The second base region 125 can further include an additional second base semiconductor layer 127. This additional second base semiconductor layer 127 can also be a selectively grown epitaxial semiconductor layer on exposed surfaces of the second base semiconductor layer 126 (e.g., on an essentially horizontal top surface of the second base semiconductor layer above all second semiconductor nanosheet(s) and on an essentially vertical outer side surface). This additional second base semiconductor layer 127 can be made of the same semiconductor material as the semiconductor nanosheet(s) 112.2 (e.g., Si), the same semiconductor material as the second base semiconductor layer 126, or a layer of some other suitable base semiconductor material.

The second base region 125 can be positioned laterally between the second emitter/collector regions 121-122 and the second emitter/collector regions can also be positioned laterally immediately adjacent to (i.e., abut) the second sidewall 142 of the dielectric body 140. The second emitter/collector regions 121-122 can be selectively grown epitaxial semiconductor layers that abut the second opposing ends of the second semiconductor nanosheet(s) 112.2, respectively, and that further abut the inner portions of the second base semiconductor layer 126 above and below the second semiconductor nanosheet(s) 112.2.

This second BJT 120 can be either a PNP-type BJT or an NPN-type BJT. Thus, if the second BJT 120 is a PNP-type BJT, it can include an N-base semiconductor layer 126, an N+ additional base semiconductor layer 127, and P+ emitter/collector regions 121-122. If the second BJT 120 is an NPN-type BJT, it can include a P-base semiconductor layer 126, a P+ additional base semiconductor layer 127 and N+ emitter/collector regions 121-122.

Referring to the semiconductor structure 200 of FIGS. 2A-2D, in this embodiment the second transistor 220 can specifically be a FET (as opposed to a BJT).

This FET 220 can source/drain regions 221-222 and one or more second semiconductor nanosheets 212.2 that extend laterally between the source/drain regions. Each second semiconductor nanosheet 212.2 can have a center portion, which corresponds to a FET channel region, and opposing end portions that are positioned laterally immediately adjacent to the source/drain regions 221-222, respectively. The second semiconductor nanosheet(s) 212.2 can be either intrinsic (i.e., undoped) or doped so as to have a first-type conductivity at a relatively low conductivity level. The source/drain regions 221-222 can be selectively grown epitaxial semiconductor layers with a second-type conductivity at a relatively high conductivity level.

This FET 220 can further include a gate structure 225, which wraps around three sides (i.e., the second bottom surface, the second top surface, and the second distal side) of the center portion of each second semiconductor nanosheet 212.2. The opposing end portions of each second semiconductor nanosheet, mentioned above, can extend laterally beyond this gate structure 225 to the source/drain regions 221-222. The gate structure 225 can include a gate dielectric layer. The gate dielectric layer can include one or more layers of gate dielectric material. For example, the gate dielectric layer can include a conformal first gate dielectric layer 264 (also referred to as an interfacial layer) immediately adjacent to: three surfaces of each second semiconductor nanosheet, the stop surface of the second semiconductor body 205.2, and the second sidewall 242 of the dielectric body 240 both above and below each second semiconductor nanosheet. The first gate dielectric layer 264 can be, for example, a thin SiO2 layer. Optionally, the gate dielectric layer can also include a conformal second gate dielectric layer 265, which covers the first gate dielectric layer 264. This second gate dielectric layer 265 can be, for example, a high-K gate dielectric layer (i.e., a layer of dielectric material with a dielectric constant that is greater than 3.9 including, for example, hafnium (Hf)-based dielectrics, such as hafnium oxide, hafnium silicon oxide, hafnium silicon oxynitride, or hafnium aluminum oxide, or other suitable high-k dielectrics, such as aluminum oxide, tantalum oxide, or zirconium oxide). It should be noted that the gate dielectric layer (including, for example, the combination of layers 264 and 265, as illustrated) are relatively thin and do not completely fill the space between the top surface of the second semiconductor body 205.1 and the second semiconductor nanosheet above or any spaces between adjacent second semiconductor nanosheets (if applicable).

The gate structure 225 can further include a gate conductor layer 268 on the gate dielectric layer. The gate conductor layer 268 can fill the remaining space between the top surface of the second semiconductor body 205.2 and the second semiconductor nanosheet above and any spaces between adjacent second semiconductor nanosheets 212.2 (if applicable). The gate conductor layer 268 can further be above the uppermost second semiconductor nanosheet and positioned laterally adjacent to the second distal side(s) of each second semiconductor nanosheet. Thus, the overall width of the gate structure 255, as measured from the second sidewall 242 of the dielectric body 240 across and parallel to the second semiconductor nanosheet(s) is greater than the width of the second semiconductor nanosheet(s). The gate conductor layer 268 can include one or more layers of gate conductor material. The gate conductor layer 268 can include, for example, a work function metal layer, a doped polysilicon gate conductor layer, and/or some other suitable gate conductor material.

As mentioned above, in some embodiments, the space between the top surface of the semiconductor body 205.2 and the above second semiconductor nanosheet and the spaces between any adjacent second semiconductor nanosheets can all be approximately 8.5 nm. In this case, the thickness of the gate dielectric layer (e.g., the combined thicknesses of the conformal first and second gate dielectric layers 264-265) can be approximately 2 nm and the portions of the gate conductor layer 268 between the top surface of the second semiconductor body and the above second semiconductor nanosheet and also between any adjacent semiconductor nanosheets (if applicable) can all be approximately 4.5 nm.

As mentioned above, this FET 220 can be either an NFET or a PFET. For an NFET, the channel region(s) can be intrinsic (i.e., undoped) channel regions or P-channel regions and the source/drain regions 221-222 can be N+ source/drain regions. For a PFET, the channel region(s) can be either intrinsic (i.e., undoped) channel regions or N-channel regions and the source/drain regions 221-222 can be P+ source/drain regions. Additionally, those skilled in the art will recognize that the configuration of the gate structure 255 can also vary depending upon whether the FET is an NFET or a PFET. For example, the optimal effective work function for the gate structure of an NFET is between about 3.9 eV and about 4.2 eV, whereas the optimal effective work function for the gate structure of a PFET is between about 4.9 eV and about 5.2 eV. A doped polysilicon gate conductor could be used to achieve the different work functions (e.g., P-doped poly for a PFET or N-doped poly for an NFET). Alternatively, different metal or metal alloys could be used to achieve the different work functions. Exemplary metals (and metal alloys), which have a work function within the range optimal for NFET performance (i.e., between 3.9 eV and about 4.2 eV) include, but are not limited to, hafnium, zirconium, titanium, tantalum, aluminum, and alloys thereof, such as, hafnium carbide, zirconium carbide, titanium carbide, tantalum carbide, and aluminum carbide. Exemplary metals (and metal alloys), which have a work function within the range optimal for PFET performance (i.e., between about 4.9 eV and about 5.2 eV) include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Alternatively, a dual work function metal or metal alloy material suitable for use in either an NFET or a PFET could be used for the gate conductor layer.

The FET 220 can further include a combination of spacers that electrically isolate the gate structure 255 and, particularly, the gate conductor layer 268 thereof from the adjacent source/drain regions 221-222. These spacers can include both inner spacers 248 and gate sidewall spacers 247. Each inner spacer 248 can be below a corresponding end portion of a second semiconductor nanosheet and can further be positioned laterally between the gate structure 225 and an adjacent source/drain region. The inner spacers 248 can be made, for example, of SiO2, SiN, etc. The gate sidewall spacers 247 can be positioned laterally adjacent to and can surround the external sidewalls of the gate structure 255 including above the uppermost second semiconductor nanosheet. The gate sidewall spacers 247 can be made, for example, of a low-K dielectric material, such as silicon boron carbonitride (SiBCN), silicon oxycarbonitride (SiOCN), silicon carbonitride (SiCN) or any other suitable low-K dielectric material.

Referring again to FIGS. 1A-1D and FIGS. 2A-2D, the semiconductor structure 100, 200 can further include metal silicide layers 174, 274. The metal silicide layers 174, 274 can be, for example, on the top surfaces of each additional base semiconductor layer (e.g., see the metal silicide layers on the additional base semiconductor layers 137 and 127 of the base regions 135 and 125 in the BJTs 130 and 120, respectively, in the semiconductor structure 100; see also the metal silicide layer 274 on the additional base semiconductor layer 237 of the base region 235 in the BJT 230 in the semiconductor structure 200). Optionally, although not shown, metal silicide layers could be on the top surfaces of the emitter/collector regions of the first and second BJTs in the semiconductor structure 100, on the top surfaces of the emitter/collector regions of the BJT in the semiconductor structure 200, on the top surfaces of the source/drain regions of the FET 220 in the semiconductor structure 200, and/or on the top surface of a doped polysilicon gate conductor layer (if applicable) in the gate structure of the FET in the semiconductor structure 200. The metal silicide layers 174, 274 can be, for example, cobalt silicide layers, nickel silicide layers, tungsten silicide layers, or layers of any other suitable metal silicide material.

The semiconductor structure 100, 200 can further include multiple interlayer dielectric (ILD) material layers. The ILD material layers can include, for example, a first dielectric layer 191, 291. The first dielectric layer 191, 291 can include, for example, a SiO2 layer or some other suitable layer of ILD material that covers the emitter/collector regions 131-132 and 121-122 in the semiconductor structure 100 or the emitter/collector regions 231-232 and the source/drain regions 221-222 in the semiconductor structure 200. The ILD material layers can further include a second dielectric layer 192, 292 on the first dielectric layer 191, 291 above the first transistor 130, 230, above the second transistor 120, 220, and further above and immediately adjacent to the top surface of the dielectric body 140, 240 so that the first transistor 130, 230 and the second transistor 120, 220 are electrically isolated from each other. The second dielectric layer 192, 292 can include one or more layers of ILD dielectric material. For example, the second dielectric layer 192, 292 can include a relatively thin conformal etch stop layer (e.g., a relatively thin SiN layer) and, on the etch stop layer, a blanket layer of SiO2 layer or a blanket layer of some other suitable ILD material.

The semiconductor structure 100, 200 can further include middle of the line (MOL) contacts 176, 276, which extend from the top surface of the second dielectric layer 192, 292 down to the various terminals of the first transistor 130, 230 and the second transistor 120, 220 (or, optionally, to metal silicide layers 174, 274 thereon). Specifically, in the semiconductor structure 100, the MOL contacts 176 can include: base contacts on the base regions 135, 125 of the BJTs 130 and 120; and emitter/collector contacts on the emitter/collector regions 131-132, 121-122 of the BJTs 130 and 120. In the semiconductor structure 200, the MOL contacts 276 can include: a base contact on the base region 235 of the BJT 230; emitter/collector contacts on the emitter/collector regions 231-232 of the BJT 230; a gate contact on the gate structure 255 of the FET 220, and source/drain contacts on the source/drain regions 221-222 of the FET 220.

The disclosed semiconductor structures described above allow the minimum spacing between a pair of BJTs (e.g., as shown in the semiconductor structure 100 of FIGS. 1A-1D) or between a BJT and a FET (e.g., as shown in the semiconductor structure 200 of FIGS. 2A-2D) to be reduced as compared to the minimum spacing between two devices formed using currently available technology platforms. For example, in the current state of the art fin-type field effect transistor (finFET) processing platform, the minimum spacing between two finFETs can be, for example, approximately 60-70 nm. The minimum spacing between two lateral BJTs integrated into the finFET processing platform can also be approximately 60-70 nm. In the above-described semiconductor structure 100, 200, the minimum spacing between two devices (e.g., between two BJTs or between a BJT and a FET) is only limited by the width of the dielectric body 140, 240 and the width of the dielectric body 140, 240 is only limited by the resolution of the lithographic technique used during process and can be less 20 nm. Additionally, the disclosed semiconductor structures also exhibit reduced power consumption and improved device performance.

Also disclosed herein are method embodiments for forming a forksheet semiconductor structure that includes at least one BJT (e.g., a BJT forksheet semiconductor structure 100 as described in detail above and illustrated in FIGS. 1A-1D or a hybrid forksheet semiconductor structure 200 as described in detail above and illustrated in FIGS. 2A-2D). Generally, the method can include forming a first transistor. The first transistor can be formed so that it includes at least one first semiconductor nanosheet positioned laterally immediately adjacent to a first sidewall of a dielectric body. The method can further include forming a second transistor so that it includes a second semiconductor nanosheet positioned laterally immediately adjacent to a second sidewall of the dielectric body opposite the first sidewall. The first transistor and the second transistor can further be formed so that at least the first transistor is a BJT. For example, the first transistor and the second transistor can both be formed as BJTs (e.g., as in the BJT forksheet semiconductor structure 100 of FIGS. 1A-1D) or the first transistor can be formed as a BJT and the second transistor can be formed as a FET (e.g., as in the hybrid forksheet semiconductor structure 200 of FIGS. 2A-2D).

Figure 3:
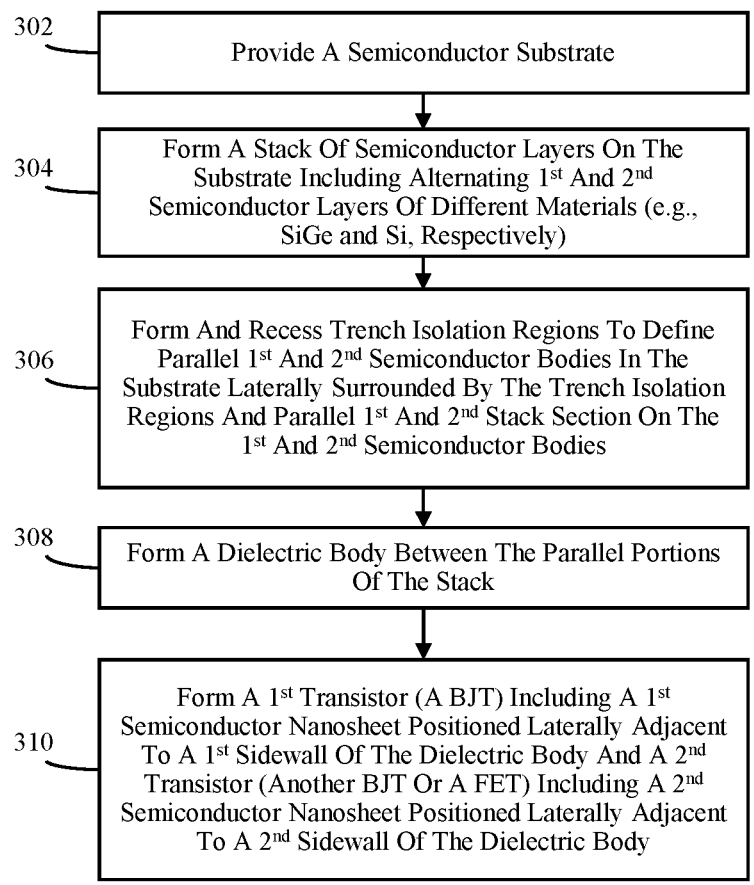
FIG. 3 is a flow diagram illustrating disclosed method embodiments for forming the forksheet semiconductor structures of FIGS. 1A-1D and FIGS. 2A-2D.
Figure 4:
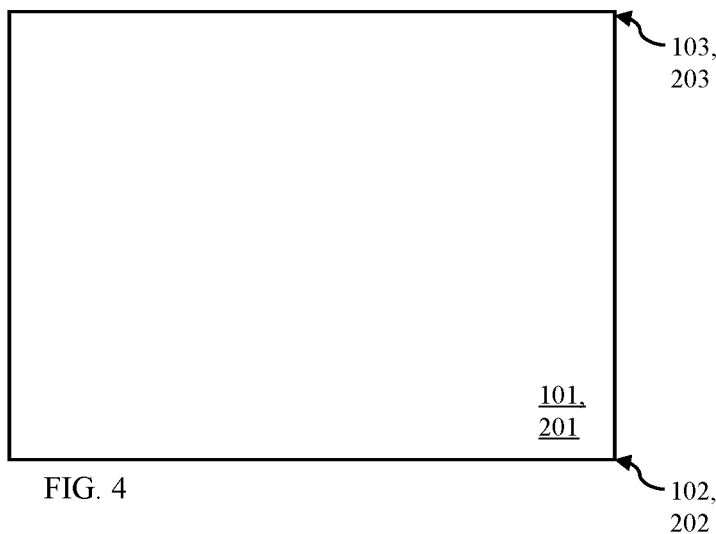
FIGS. 4-5 are cross-section diagram illustrating partially completed semiconductor structures formed according to the flow diagram of FIG. 3.

FIG. 3 is a flow diagram illustrating generally the disclosed method embodiments. The method can include providing a semiconductor substrate 101, 201 (see process 302 and FIG. 4). The semiconductor substrate 101, 201 can be, for example, a bulk semiconductor substrate such as a bulk monocrystalline Si substrate with a first surface 102, 202 (i.e., a bottom surface) and a second surface 103, 203 (i.e., a top surface) opposite the first surface.

Figure 5:
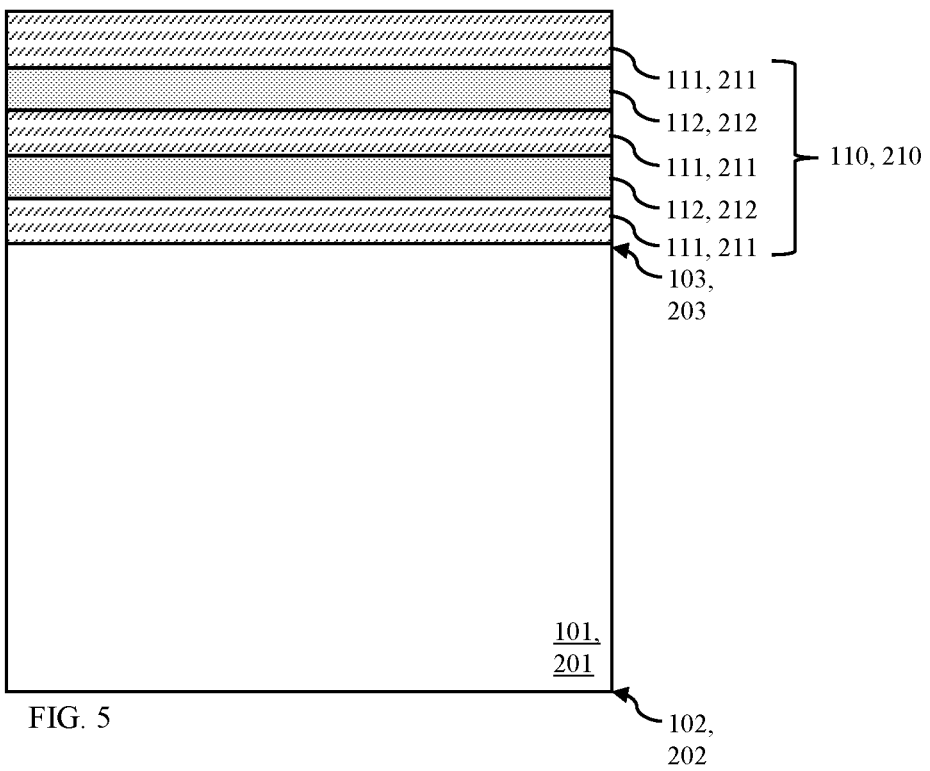

The method can include forming a stack 110, 210 of semiconductor layers on the top surface 103, 203 of the semiconductor substrate 101, 201 (see process 304 and FIG. 5). The stack 110, 210 can be formed that it includes alternating first semiconductor layers 111, 211 (also referred to herein as sacrificial semiconductor layers) and second semiconductor layers 112, 212 (also referred to herein as active semiconductor layers). The stack 110, 210 can further be formed so that the lowermost layer and the uppermost layer in are first semiconductor layers. The first semiconductor layers 111, 211 and the second semiconductor layers 112, 212 epitaxially grown semiconductor layers so that they are monocrystalline in structure. They can further comprise different semiconductor materials such that, during subsequent processing, the first semiconductor layers 111, 211 (i.e., the sacrificial semiconductor layers) can be selectively removed, while exposed surfaces of the semiconductor substrate 101, 201 and the second semiconductor layers 112, 212 intact. In some embodiments, the first semiconductor layers 111, 211 can be SiGe layers and the second semiconductor layers 112, 212 can be Si layers and the stack 110, 210 can be referred to as a Si/SiGe superlattice. In some embodiments, the first semiconductor layers 111, 211 can have a thickness of 5-10 nm (e.g., approximately 8.5) and the second semiconductor layers 112, 212 can have a thickness of 3-10 nm (e.g., approximately 6.5 nm).

Figure 6A:
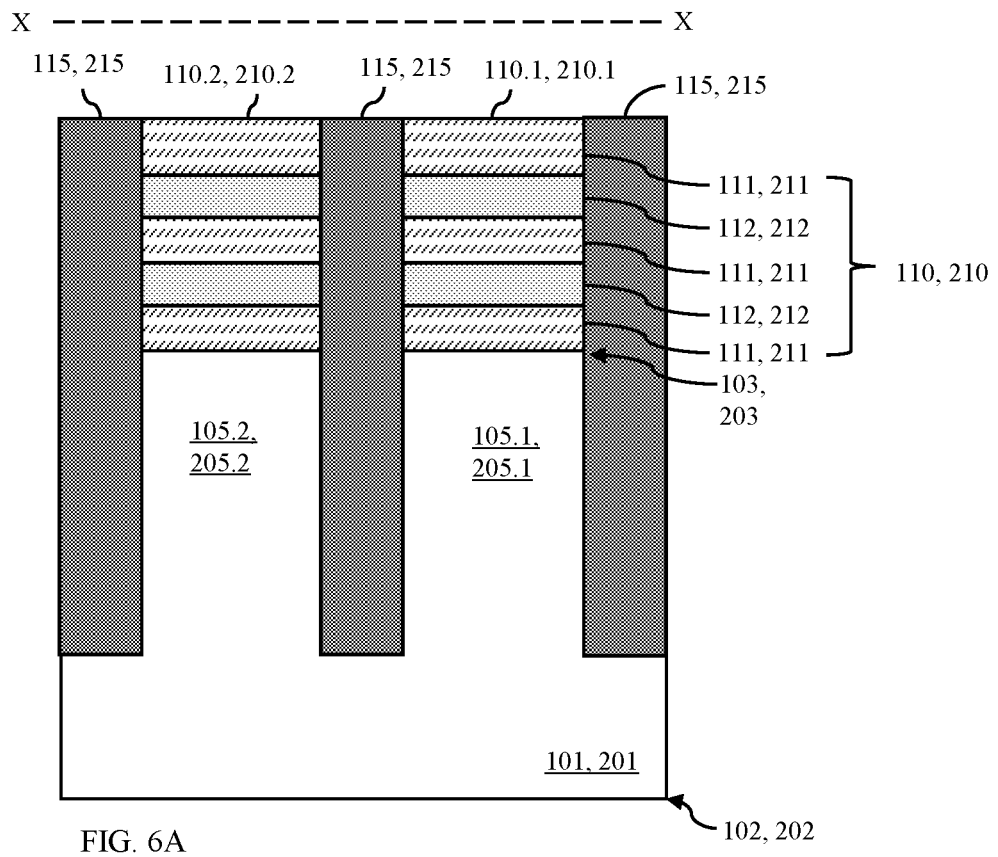
FIG. 6A is a cross-section diagram illustrating a partially completed semiconductor structure formed according to the flow diagram of FIG. 3
Figure 6B:
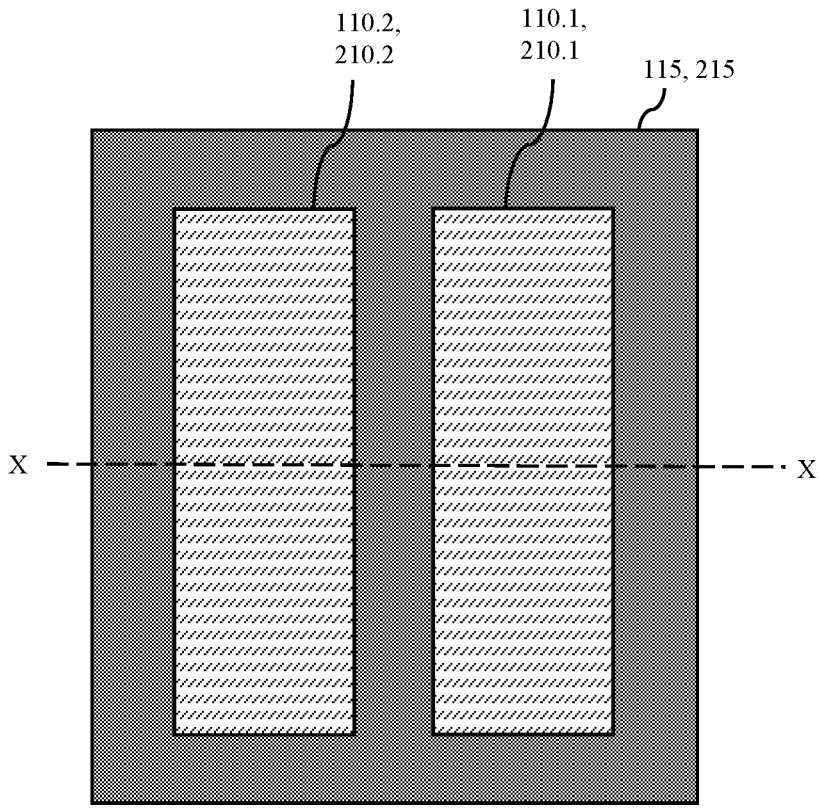
FIG. 6B is a top view diagram of the same structure.
Figure 7:
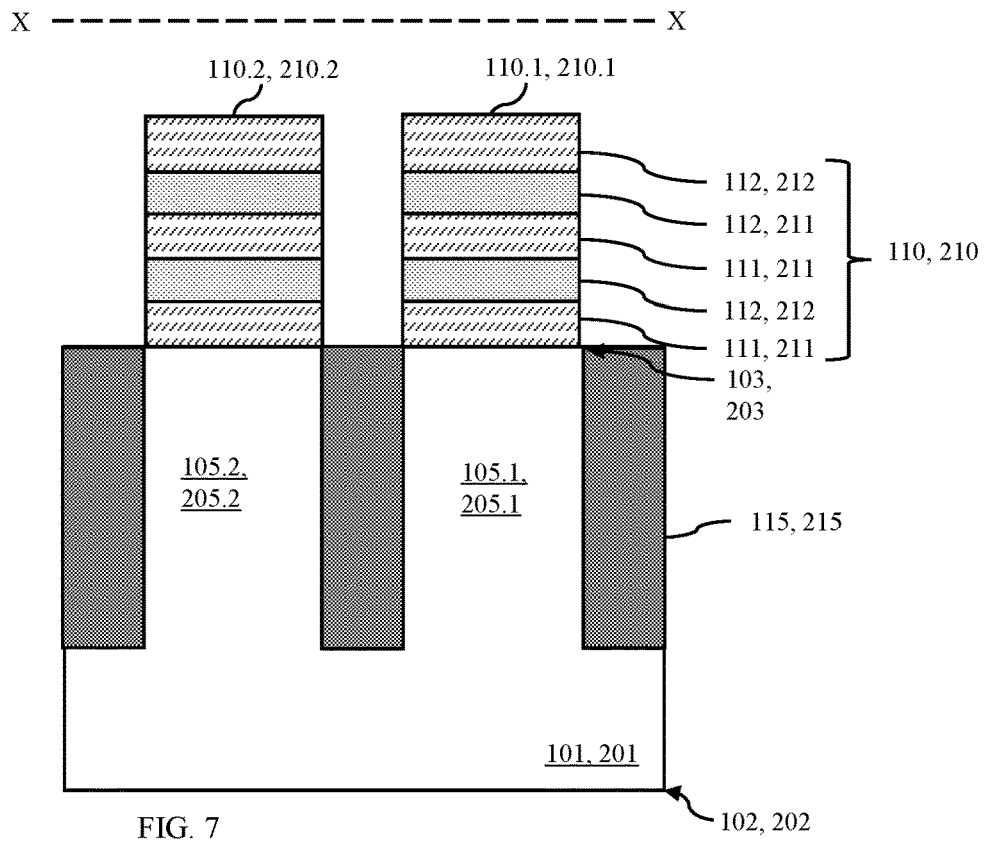
FIGS. 7-8 are cross-section diagram illustrating partially completed semiconductor structures formed according to the flow diagram of FIG. 3.

The method can further include forming trench isolation regions 115, 215, which extend vertically from the top of the stack 110, 210 into the semiconductor substrate 101, 201, and further recessing the top surfaces of the trench isolation regions 115, 215 so that they are approximately level with the top surface 103, 203 of the semiconductor substrate 101, 201 (see process 306 and FIGS. 6A-6B and 7). The trench isolation regions 115, 215 can be formed, for example, by forming trenches (e.g., using conventional lithographic patterning and etch techniques) and further filling the trenches with one or more layers of isolation material. The isolation material can include, for example, SiO2 or some other suitable isolation material. The isolation material can then be recessed so as to expose the lowermost semiconductor layer in the stack 110, 210 (e.g., a CMP process can be used to remove SiO2 from above the stack and to recess or etch back the SiO2 material within the trenches). It should be noted that patterning of the trenches for the trench isolation regions can be performed so as to define, within the semiconductor substrate, a pair of adjacent essentially parallel semiconductor bodies 105.1-105.2, 205.1-205.2 (i.e., a first semiconductor body 105.1, 205.1 and a second semiconductor body 105.2, 205.2) and, above the first semiconductor body 105.1, 205.1 and the second semiconductor body 105.2, 205.2, a discrete first stack section 110.1, 210.1 and a discrete second stack section 110.2, 210.2. The first semiconductor body 105.1, 205.1 and the second semiconductor body 105.2, 205.2 can be separated by a trench isolation region 115, 215 having a predetermined width and, thus, the first stack section 110.1, 210.1 and the second stack section 110.2, 210.2 are separated by a space with the same predetermined width.

Figure 8:
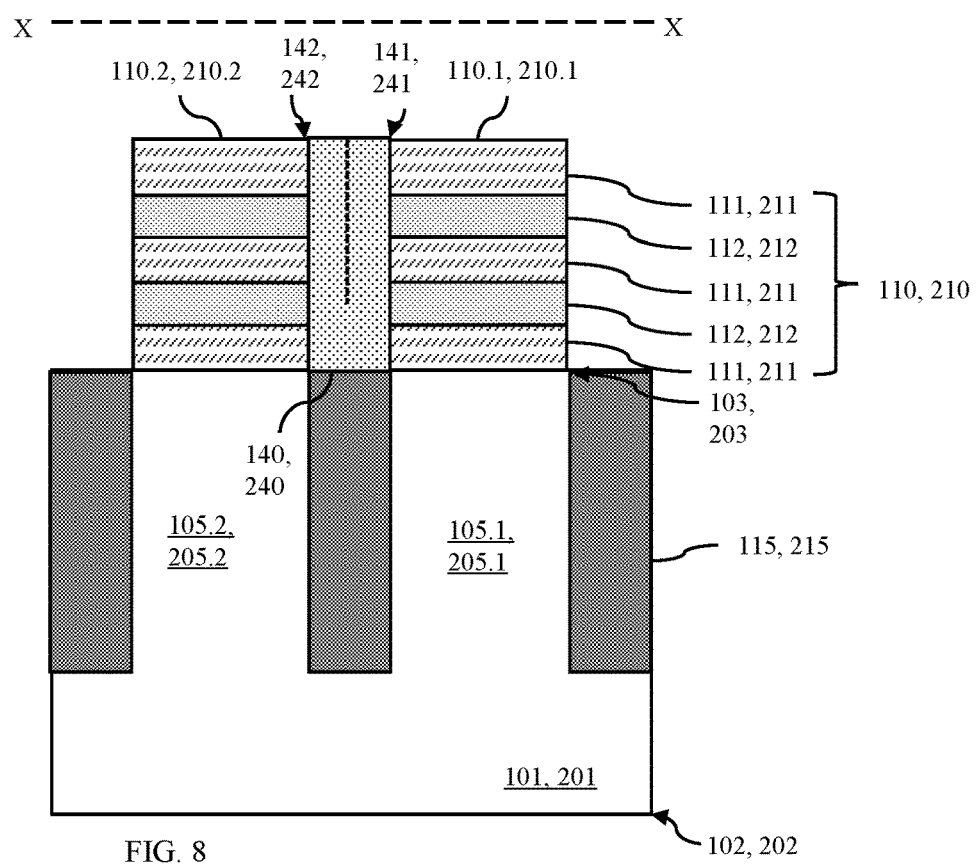

The method can further include forming a dielectric body 140, 240 between the first stack section 110.1, 210.1 and the second stack section 110.2, 210.2 (see process 308 and FIG. 8). For example, a layer of dielectric material can be conformally deposited over the partially completed structure, covering exposed surfaces of the first stack section 110.1, 210.1 and the second stack section 110.2, 210.2 and filling the space between them. The dielectric material can be SiN or some other suitable dielectric material. A selective isotropic etch process can subsequently be performed to remove the dielectric material from the top and outer side surfaces of the first and second stack sections, stopping before the dielectric material within the space between the first and second stack sections is etched away, thereby forming the dielectric body 140, 240.

The method can further include forming a pair of transistors including a first transistor 130, 230 positioned laterally adjacent to a first sidewall 141, 241 of the dielectric body 140, 240 and a second transistor 120, 220 positioned laterally adjacent to a second sidewall 142, 242 of the dielectric body 140, 240 (see process 310). Process 310 can specifically be performed so that both the first transistor 130 and the second transistor 120 are BJTs, as in the semiconductor structure 100 of FIGS. 1A-1D. In this case, the first transistor 130 and the second transistor 120 can both be formed as PNP-type BJTs, as NPN-type BJTs, or as a PNP-type BJT and an NPN-type BJT. Alternatively, process 310 can specifically be performed so that the first transistor 230 is a BJT and so that the second transistor 220 is a FET, as in the semiconductor structure 200 of FIGS. 2A-2D. In this case, the first transistor 230 and the second transistor 220 can be formed as a PNP-type BJT and a PFET, a PNP-type BJT and an NFET, an NPN-type BJT and a PFET; or an NPN-type BJT and an NFET.

Figure 9A:
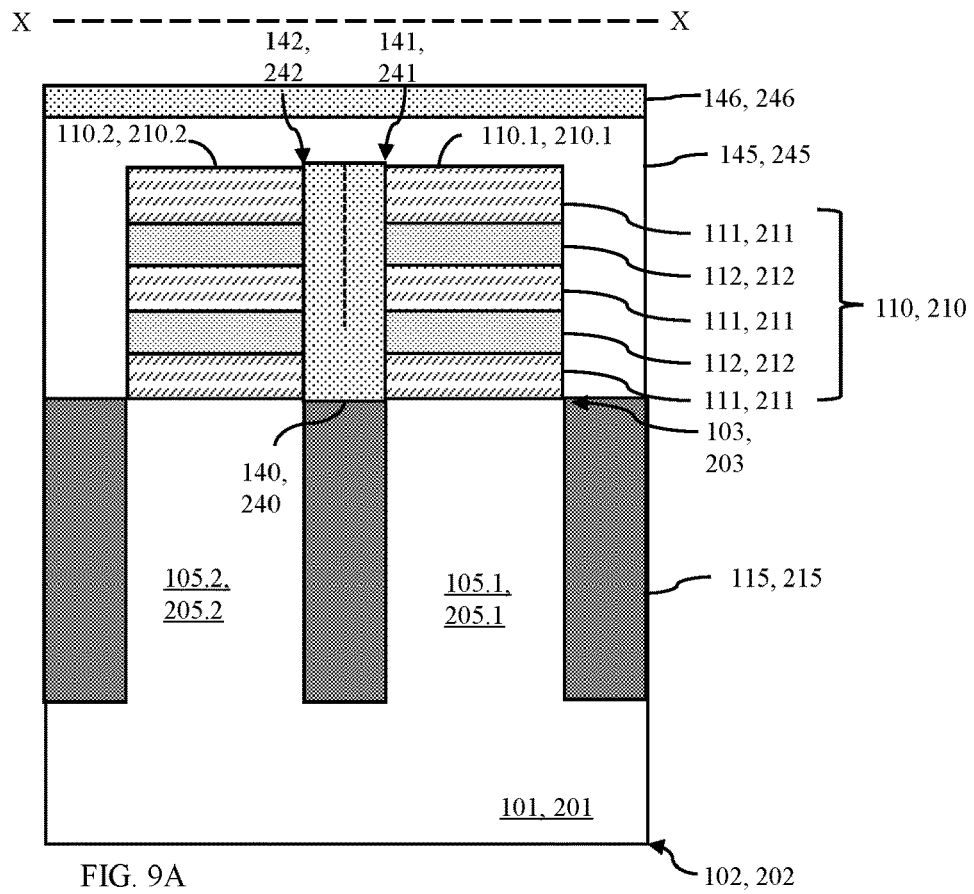
FIG. 9A is a cross-section diagram illustrating a partially completed semiconductor structure formed according to the flow diagram of FIG. 3
Figure 9B:
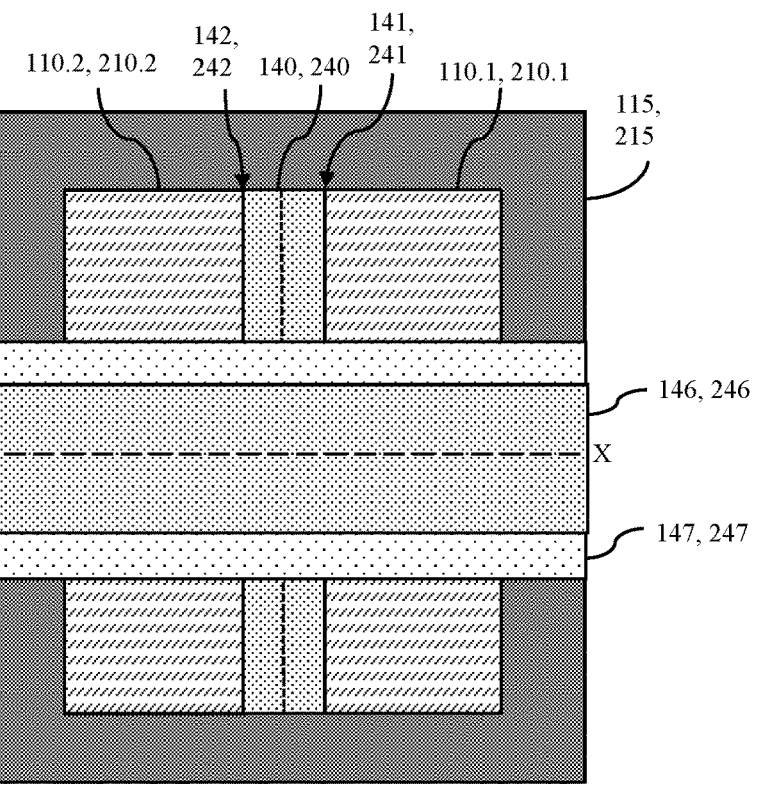
FIG. 9B is a top view diagram of the same structure.

In either case, formation of the first transistor 130, 230 and the second transistor 120, 220 at process 310 can begin with the formation of a dummy gate 145, 245 (also referred to herein as a sacrificial gate) including a dielectric cap 146, 246 on the top surface of the dummy gate 145, 245 and gate sidewall spacers 147, 247 positioned laterally adjacent to external sidewalls of the dummy gate 145, 245 (FIGS. 9A-9B). The dummy gate 145, 245 can be formed so that it traverses the first stack section 110.1, 210.1, the dielectric body 140, 240, and the second stack section 110.2, 210.2. Formation of the dummy gate can include formation of a thin conformal dielectric layer (e.g., a thin SiO2 layer (not shown)) over the partially completed structure. Then, a blanket sacrificial gate layer can be deposited onto the conformal dielectric layer. This blanket sacrificial gate layer can be a layer of a suitable sacrificial gate material (e.g., polysilicon, amorphous Si, etc.), which is different from the materials of the semiconductor substrate and of the first and second semiconductor layers in the stack 110, 210 and which can be selectively and isotropically etched away from these materials during subsequent processing. A sacrificial dielectric cap layer (e.g., a SiN cap layer) can be deposited onto the sacrificial gate layer. The resulting sacrificial gate stack can be lithographically patterned and etched to form the dummy gate 145, 245 with the dielectric cap 146, 246. A conformal layer of gate sidewall spacer material can be deposited over the partially completed structure. Then, an anisotropic etch process can be performed to remove exposed horizontal portions of this gate sidewall spacer material, thereby forming the gate sidewall spacers 147, 247 positioned laterally adjacent to external vertical surfaces of the dummy gate 145, 245. The gate sidewall material can be, for example, a low-K dielectric material, such as SiBCN, SiOCN, SiCN or any other suitable low-K dielectric material.

Figure 10:
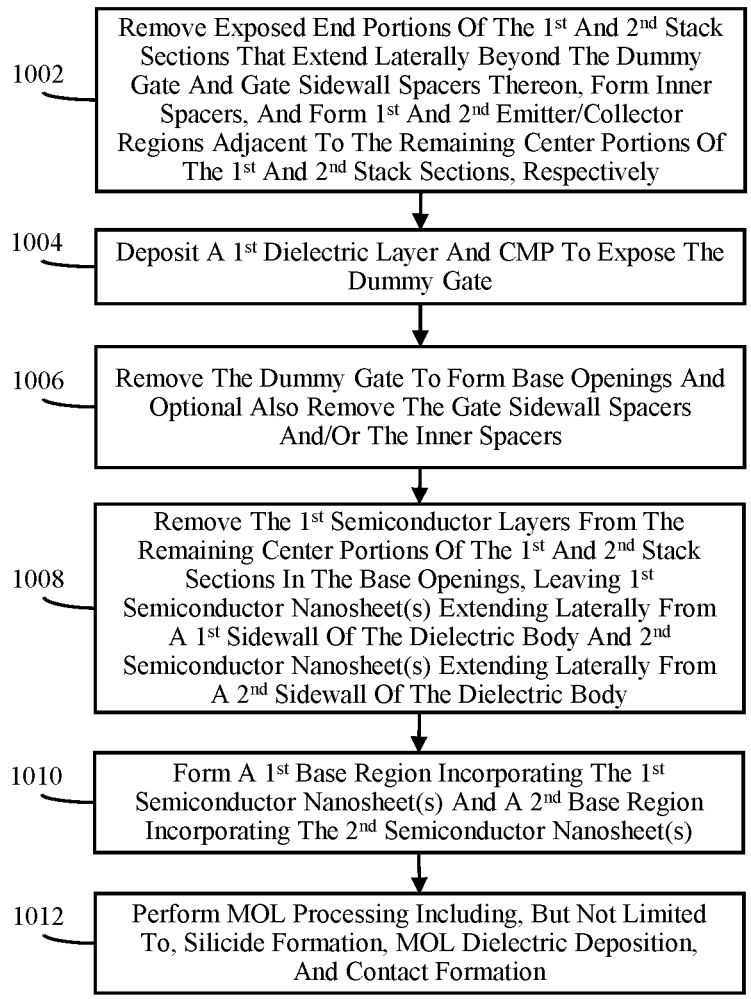
FIG. 10 is a flow diagram further illustrating process 310 of FIG. 3 with respect to the formation of the forksheet semiconductor structure of FIGS. 1A-1D.
Figure 11A:
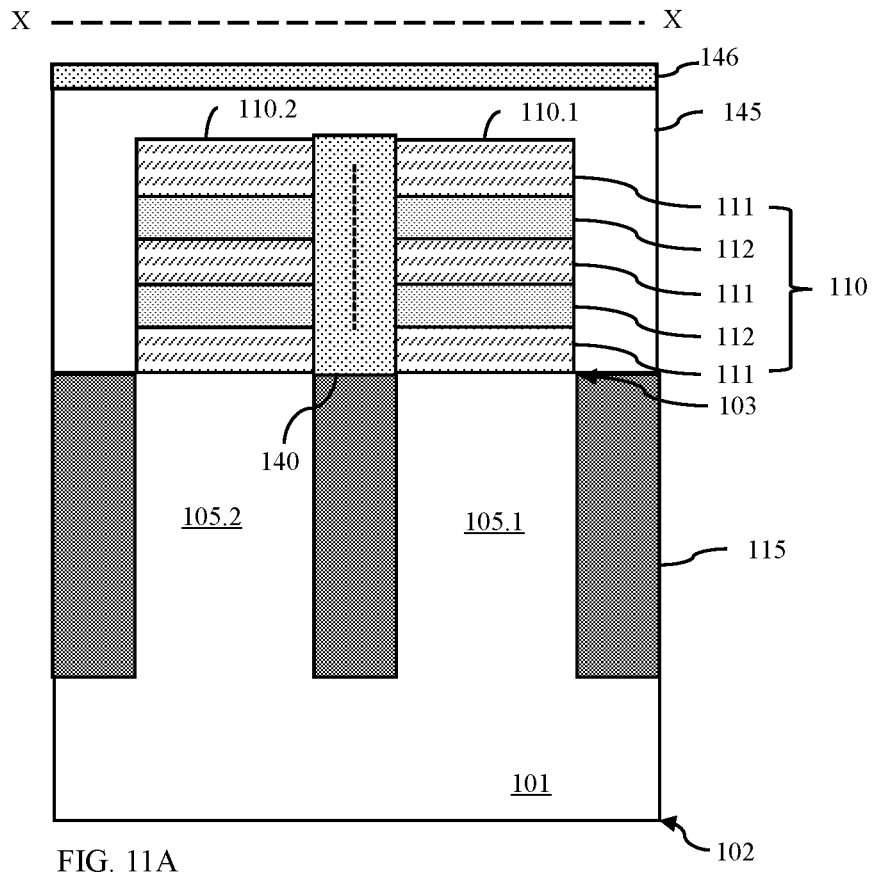
FIGS. 11A, 11C, and 11D are different cross-section diagrams illustrating a partially completed semiconductor structure formed according to the flow diagram of FIG. 10
Figure 11B:
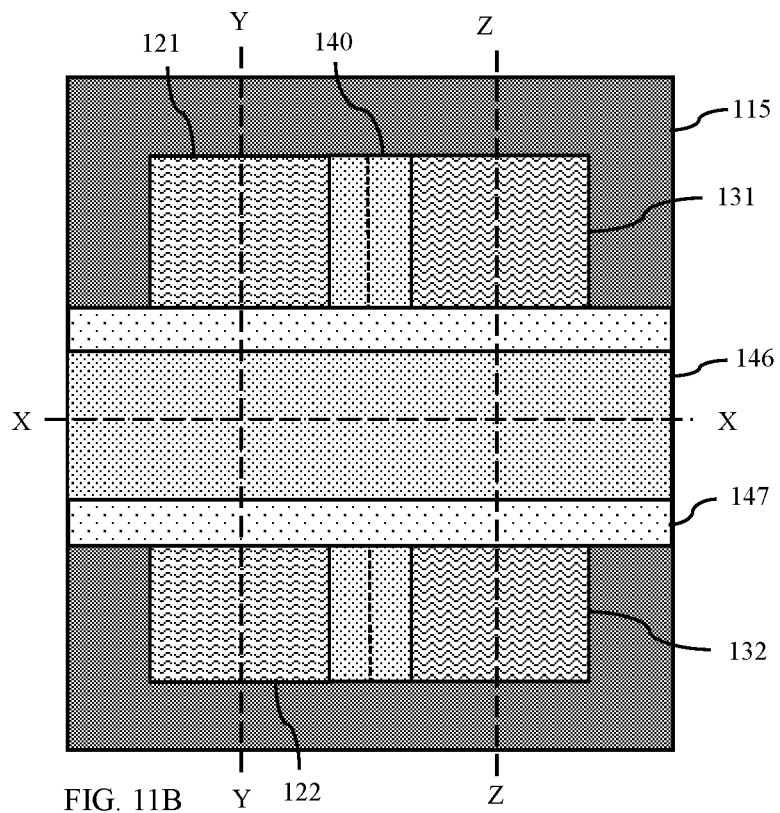
FIG. 11B is a top view diagram of the same structure.
Figure 11C:
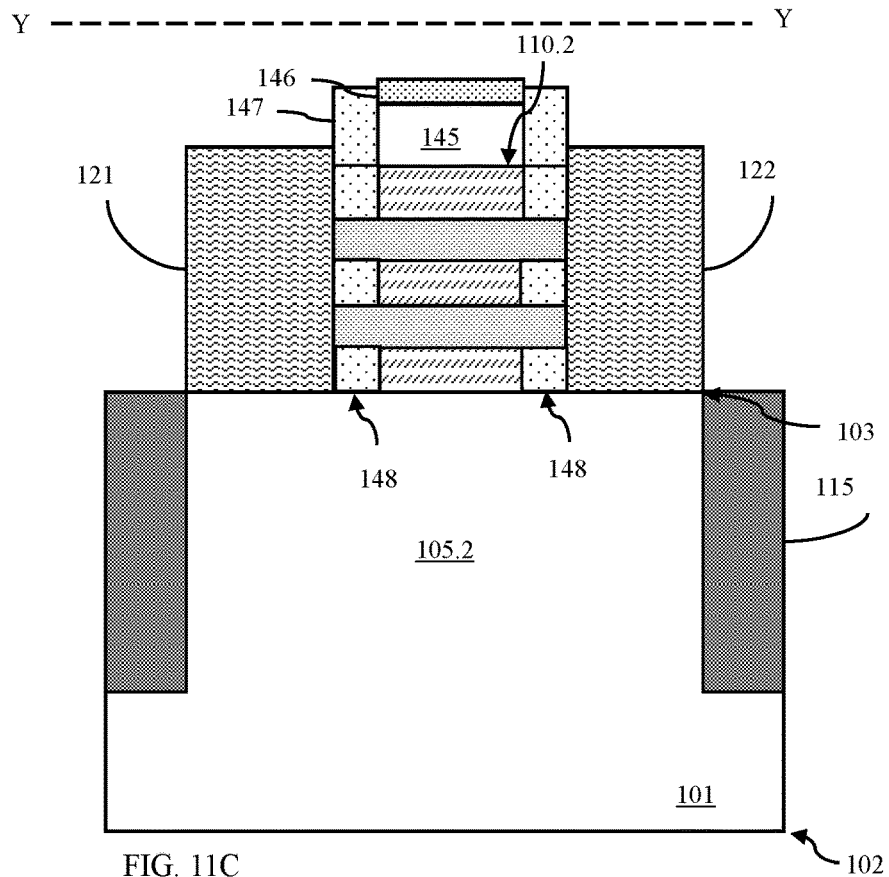
Figure 11D:
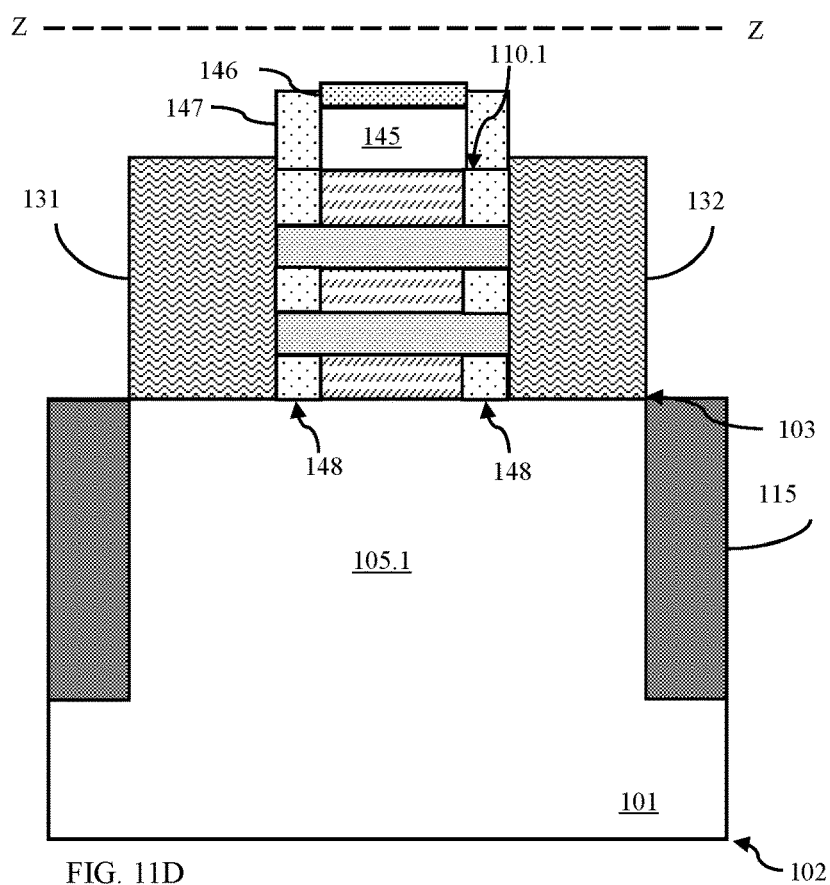
Figure 12A:
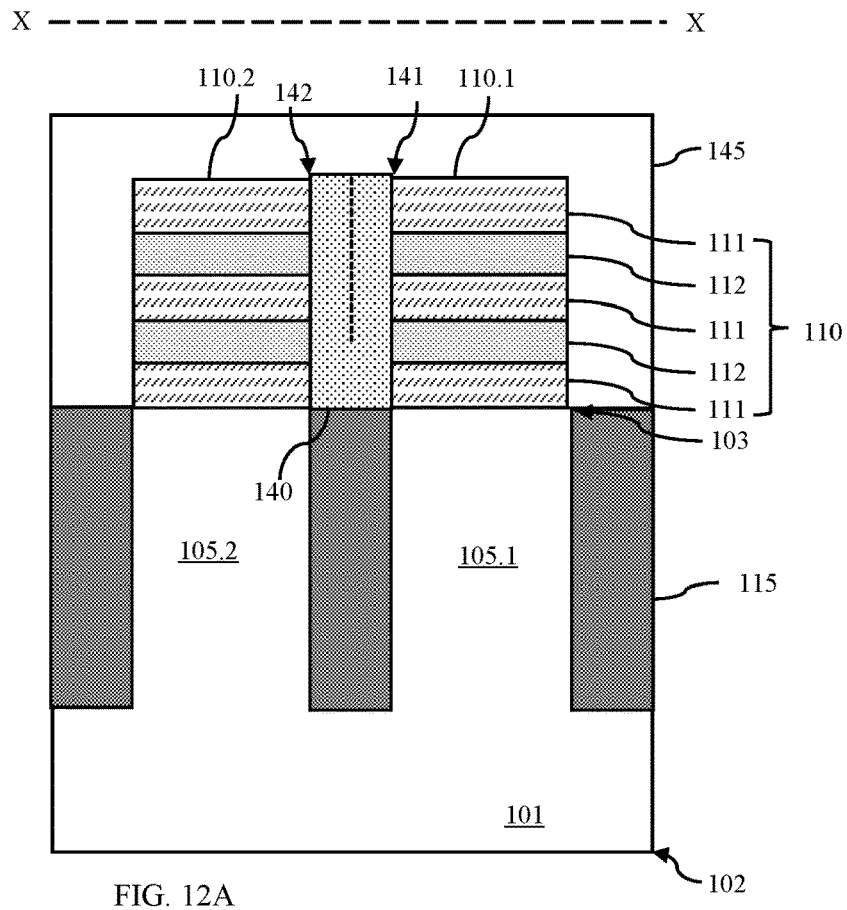
FIGS. 12A, 12C, and 12D are different cross-section diagrams illustrating a partially completed semiconductor structure formed according to the flow diagram of FIG. 10
Figure 12B:
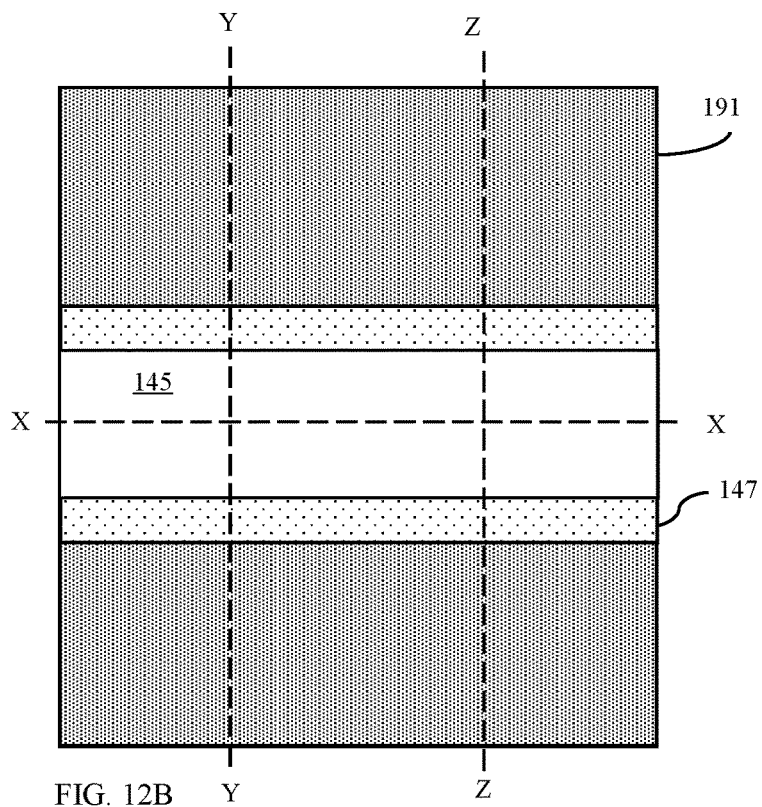
FIG. 12B is a top view diagram of the same structure.
Figure 12C:
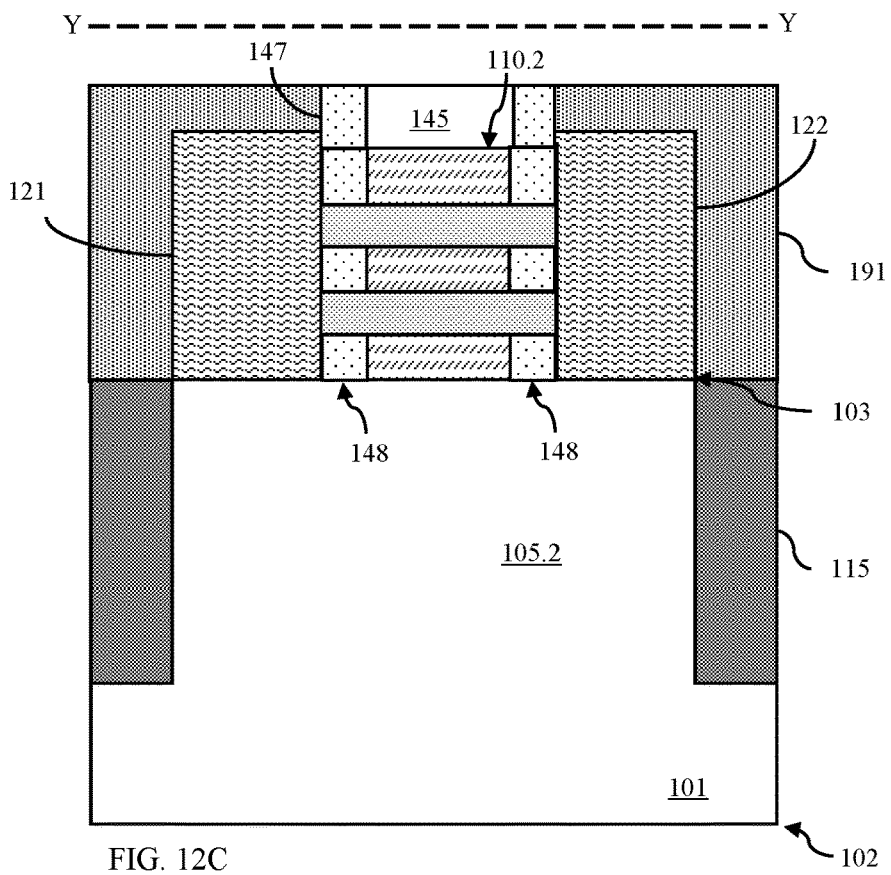
Figure 12D:
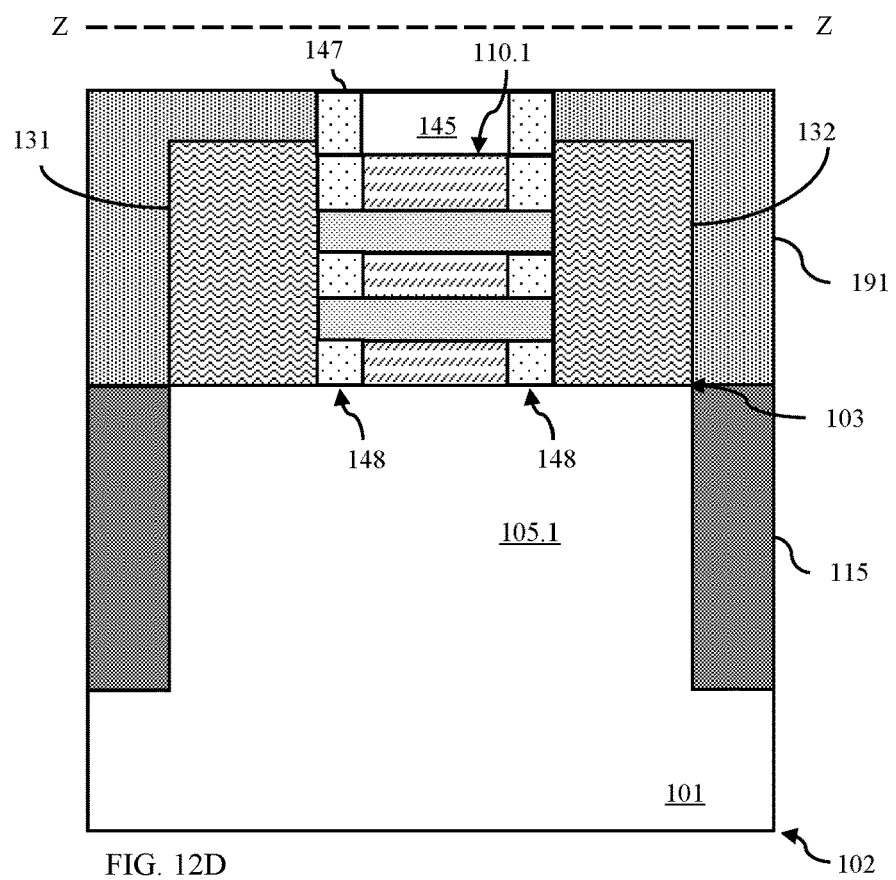

The flow diagram of FIG. 10 illustrates further illustrates process 310 and, particularly, exemplary processes that can be performed at process 310 of FIG. 3 in order to form the BJT forksheet semiconductor structure 100 of FIGS. 1A-1D, where both the first transistor 130 and the second transistor 120 are both BJTs.

First emitter/collector regions 131-132 for the first transistor 130 can be formed above the first semiconductor body 105.1 on both sides of the dummy gate 145 and second emitter/collector regions 121-122 for the second transistor 120 can be formed above the second semiconductor body 105.2 also on both sides of the dummy gate 145 (see process 1002 and FIGS. 11A-11D). For example, a selective anisotropic etch process could be performed in order to remove end portions of the first stack section 110.1 and end portions of the second stack section 110.2 that extend laterally beyond the dummy gate 145 and gate sidewall spacers 147 thereon. Inner spacers 148 can be formed, as illustrated. For example, a selective lateral etch process could be performed in order to etch back exposed vertical surfaces of the first semiconductor layers 111 from the stack sections 110.1 and 110.2 and thereby form cavities. A conformal layer of spacer material (e.g., SiO2 or SiN) can be deposited over the partially completed structure, thereby filling those cavities. A selective anisotropic etch process can be performed in order to remove this spacer material from outside the cavities, leaving the inner spacers 148 therein. Epitaxial semiconductor layers can then be selectively grown and in situ doped to form the respective emitter/collector regions.

For example, if the first transistor 130 and the second transistor 120 are both NPN-type BJTs or both PNP-type BJTs, then the epitaxial semiconductor layers can be concurrently grown. However, if the first transistor 130 and the second transistor 120 are to be different types of BJTs (e.g., a PNP-type BJT and an NPN-type BJT, respectively), separate processing would be required. For example, to form a PNP-type first BJT 130 and an NPN-type second BJT 120, a mask could be formed over second transistor side of the partially completed structure. P+ first emitter/collector regions 131-132 for the PNP-type first BJT 130 could be formed (i.e., epitaxially grown and in situ doped) on opposing sides of the dummy gate adjacent to the first stack section 110.1. The mask could be removed. Another mask could be formed over the first transistor side of the partially completed structure. N+ second emitter/collector regions 121-122 for the NPN-type second BJT 120 could be formed (e.g., epitaxially grown and in situ doped) on opposing sides of the dummy gate adjacent to the second stack section 110.1. The mask could be removed.

Figure 13A:
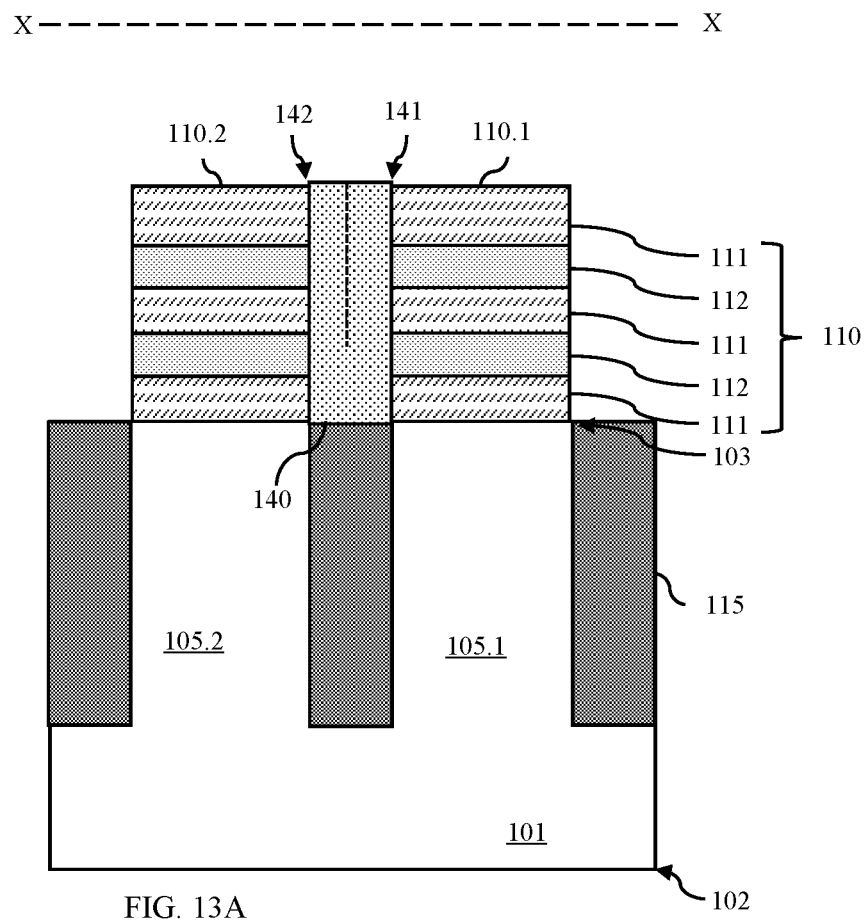
FIGS. 13A-13C are different cross-section diagrams illustrating a partially completed semiconductor structure formed according to the flow diagram of FIG. 10.
Figure 13B:
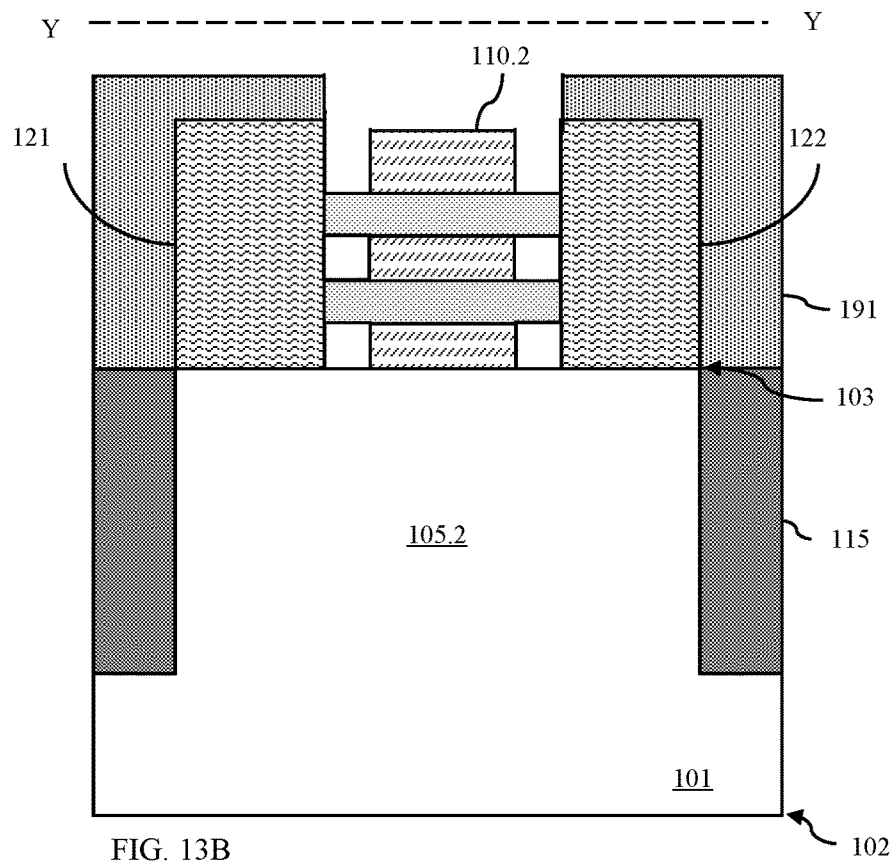
Figure 13C:
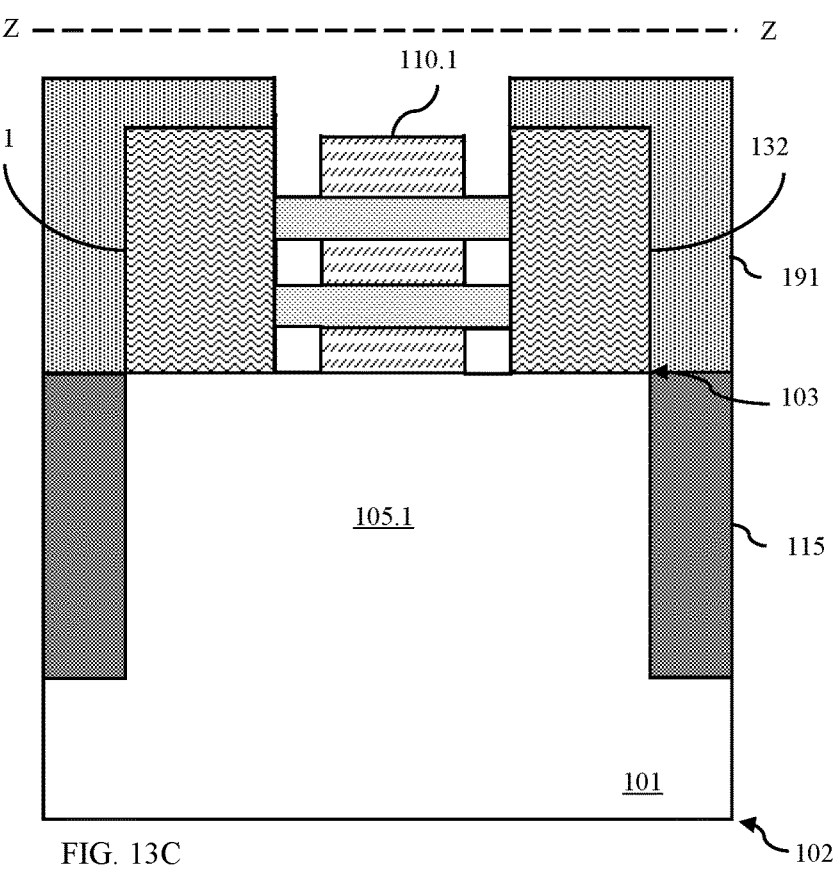

Next, a first dielectric layer 191 can be formed over the partially completed structure and a chemical mechanical polishing (CMP) process can be performed in order to remove the dielectric cap 146 and expose the top surface of the dummy gate 145 (see process 1004 and FIGS. 12A-12D). The first dielectric layer 191 can include one or more ILD material layers including, for example, at least one blanket ILD material layer made of a different dielectric material than the gate sidewall spacers 147 (e.g., a SiO2 layer or a blanket layer of some other suitable ILD material). Once exposed, the dummy gate 145 can be selectively removed, thereby forming base openings on opposing sides of the dielectric body 140 (see process 1006 and FIGS. 13A-13C). Specifically, a selective etch process can be performed to etch away the material of the dummy gate 145 over the semiconductor materials of the first stack section 110.1 and the second stack section 110.2 and also over the dielectric materials of the gate sidewall spacers 147 and first dielectric layer 191, thereby exposing top and outer sidewalls of the first stack section 110.1 and the second stack section 110.2. Etch specifications for dummy gate removal will vary depending upon the dummy gate material and the materials of other features exposed during this process. As mentioned above, formation of the dummy gate 145 typically also includes deposition of a thin conformal dielectric layer (e.g., a thin conformal SiO2 layer) prior to deposition of the dummy gate material. This thin conformal dielectric layer will protect the semiconductor materials during removal of the dummy gate. Following removal of the dummy gate 145, this conformal dielectric layer can also be removed from the resulting base openings (e.g., by buffered hydrofluoric acid (BHF) in the case of a SiO2 layer). Since electrical isolation of the emitter/collector regions from the base region of a BJT is unnecessary, the gate sidewall spacers 147 and the inner spacers 148 can also be selectively removed, as illustrated in FIGS. 13A-13C. The base openings expose the top surface and distal sidewalls of the remaining center portions of the first stack section 110.1 and the second stack section 110.2 on opposite sides of the dielectric body 140.

Figure 14:
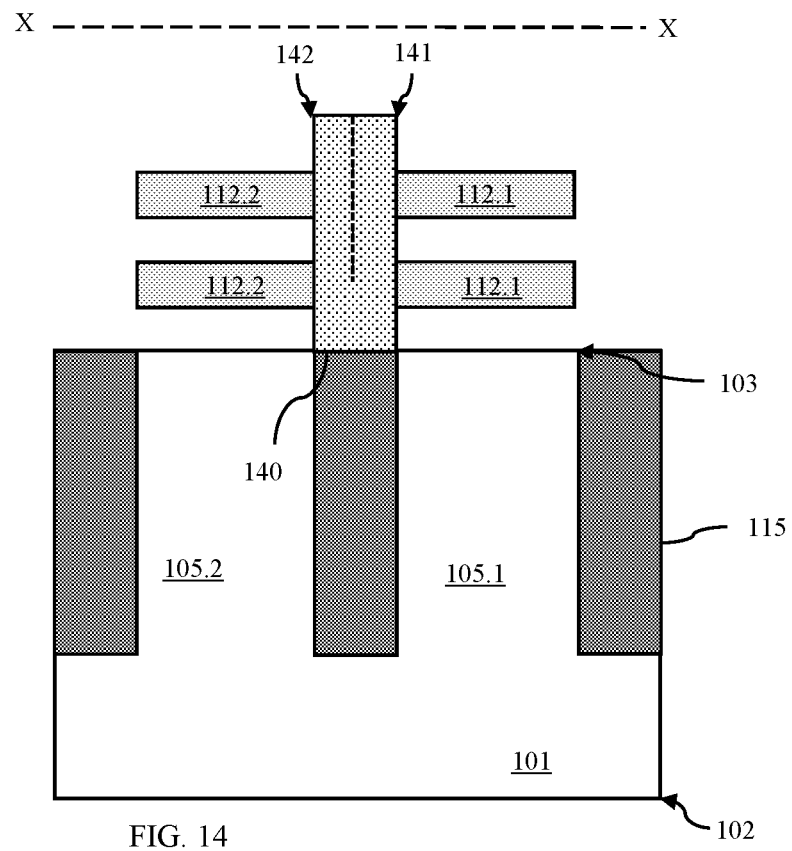
FIGS. 14-22 are cross-section diagram illustrating partially completed semiconductor structures formed according to the flow diagram of FIG. 10.
Figure 15:
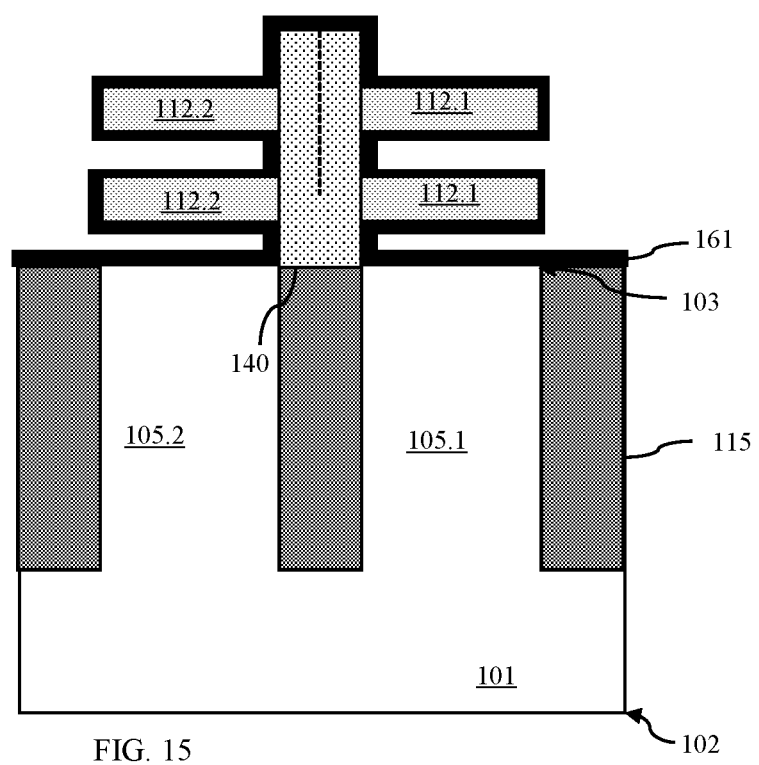
Figure 16:
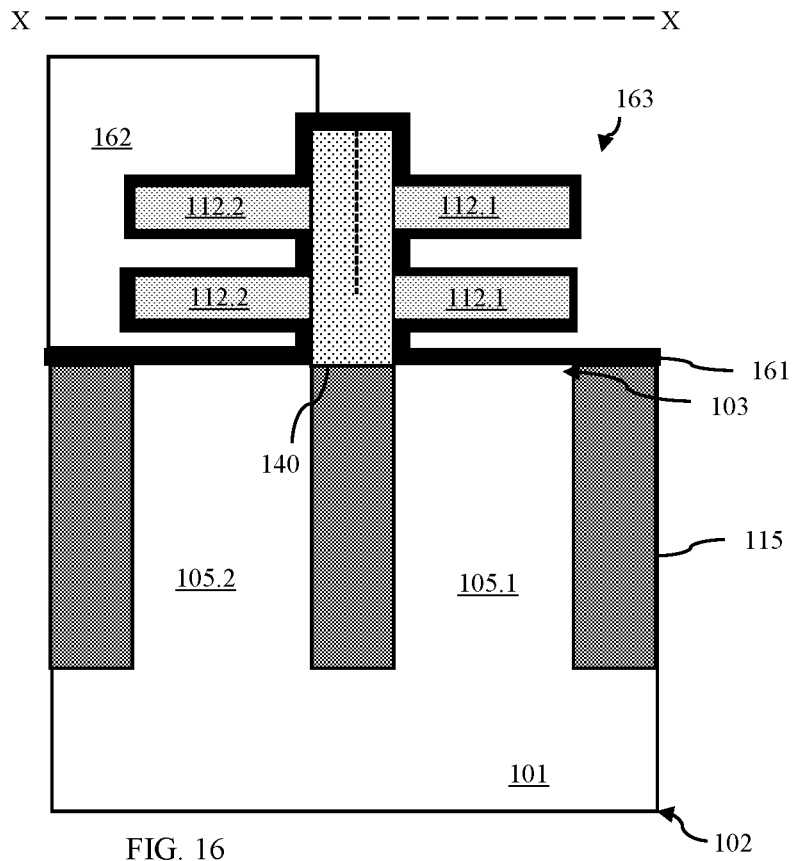
Figure 17:
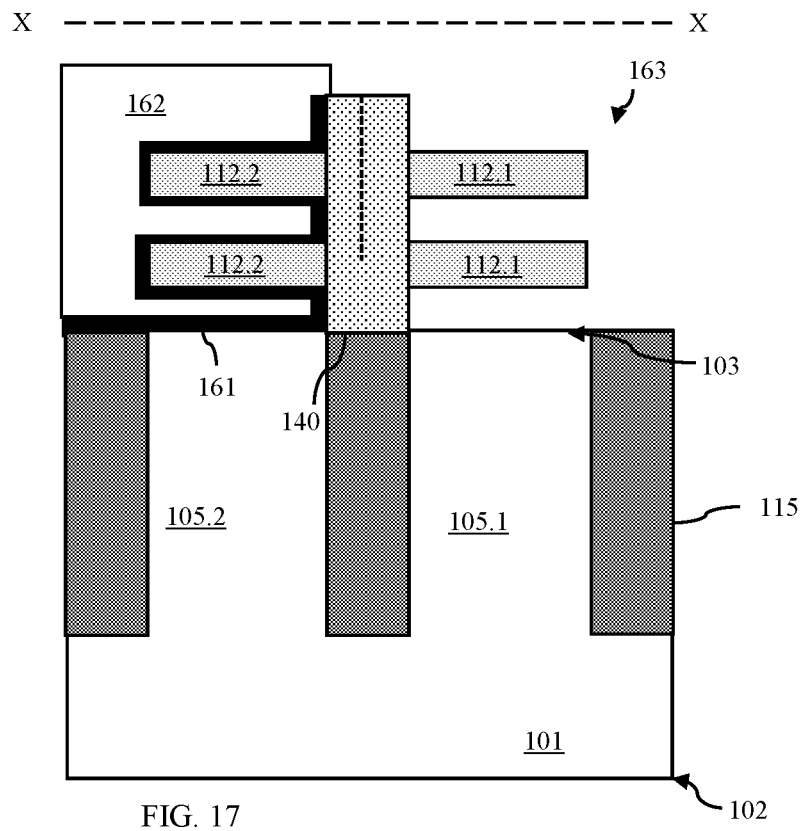
Figure 18:
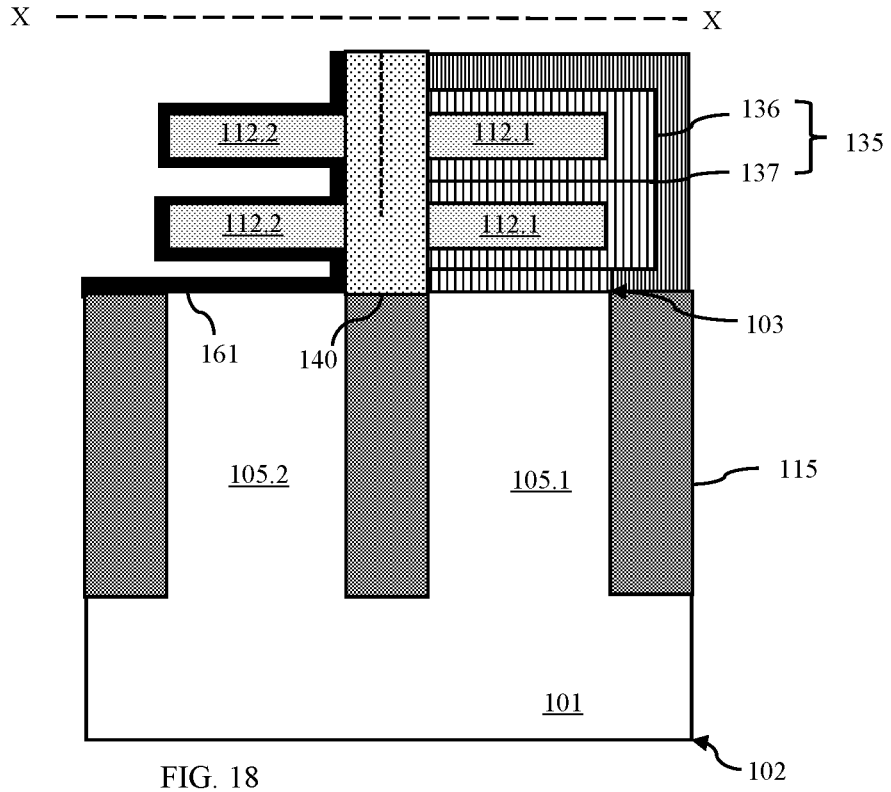
Figure 19:
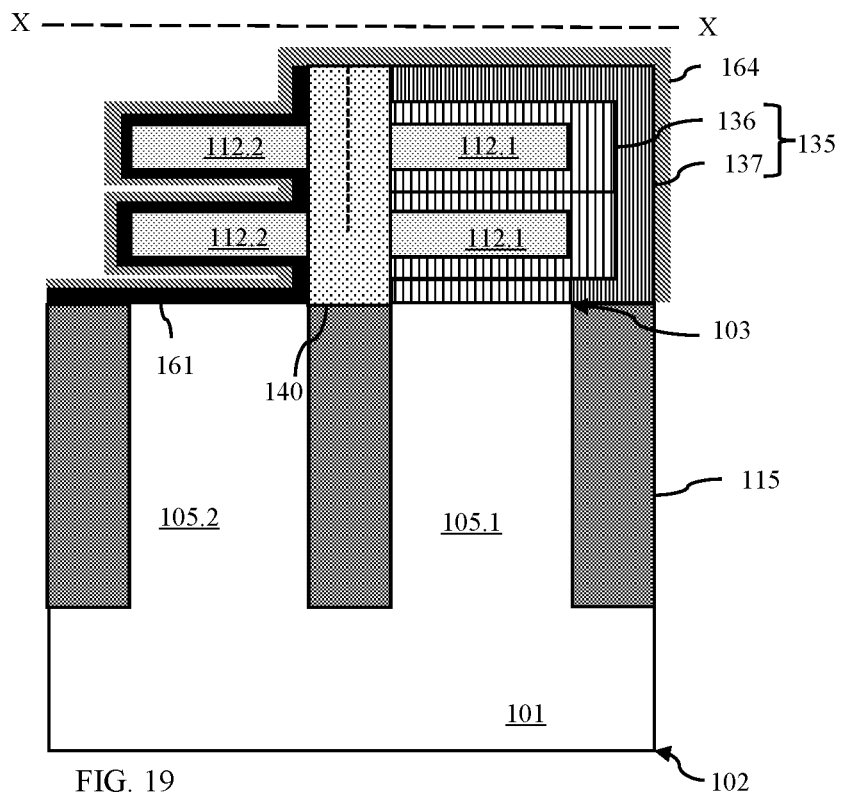
Figure 20:
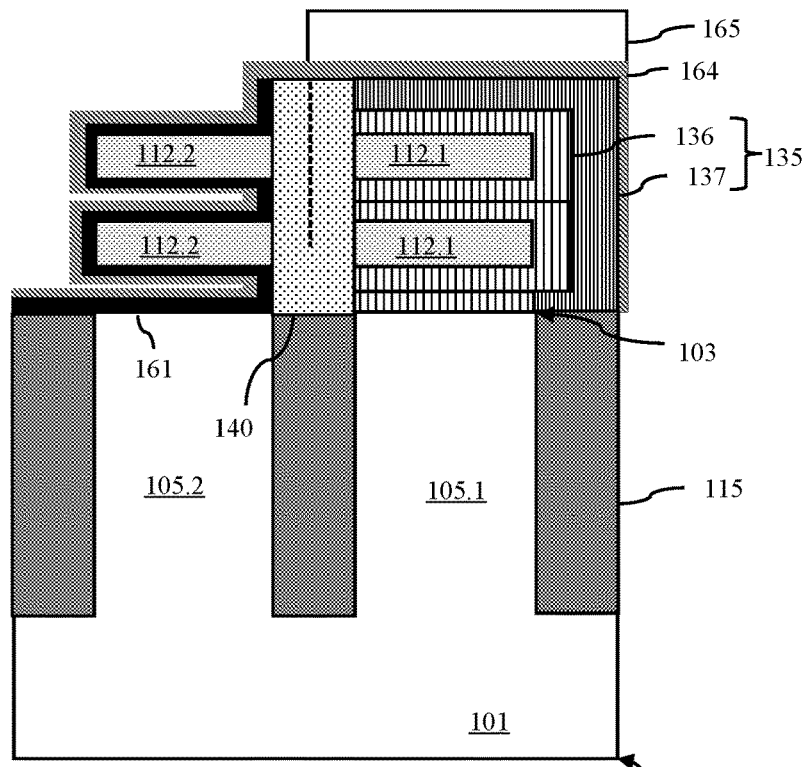
Figure 21:
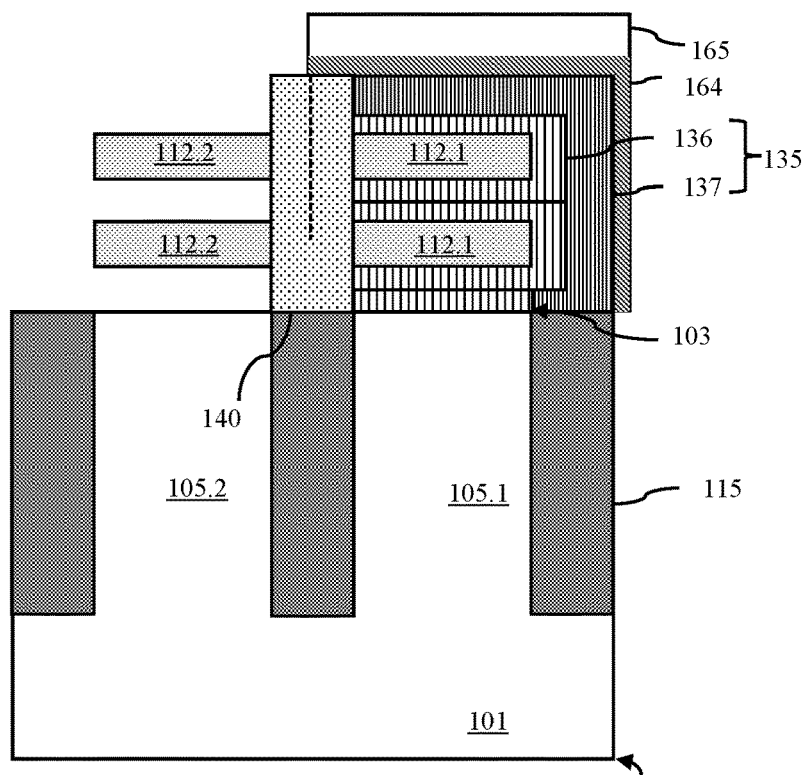
Figure 22:
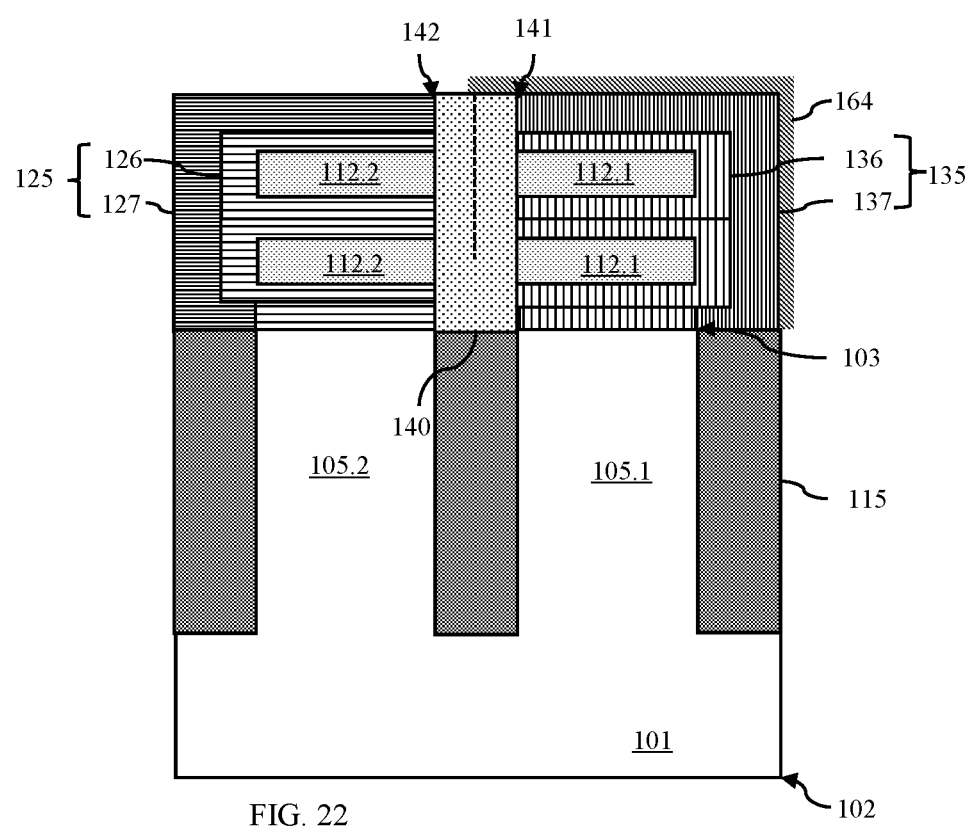

The first semiconductor layers 111 (i.e., the sacrificial semiconductor layers) within the exposed portions of the first stack section 110.1 and the second stack section 110.2 in the base openings can then be selectively removed (see process 1008 and FIG. 14). For example, if the first semiconductor layers 111 are SiGe and the second semiconductor layers 112 and the semiconductor substrate are Si, then the SiGe layers can be selectively etched away over the adjacent Si using any of the following exemplary processes: a hydrogen chloride (HCl) or chlorine trifluoride ($ClF_3$) vapor phase etch process, a dry plasma etch process, or a wet etch process with process specifications designed to ensure the selective etch of SiGe over Si and various dielectric materials. Alternatively, any other suitable selective isotropic etch process that selectively etches SiGe could be used. Thus, following process 1008, the partially completed structure will include one or more first semiconductor nanosheets 112.1 with each first semiconductor nanosheet having a first proximal side positioned laterally immediately adjacent to the first sidewall 141 of the dielectric body 140, a first distal side opposite the first proximal side, a first bottom surface, a first top surface opposite the first bottom surface, and first opposing ends adjacent to the first emitter/collector regions 131-132, respectively. The partially completed structure will also include one or more second semiconductor nanosheets 112.2 with each second semiconductor nanosheet having a second proximal side positioned laterally immediately adjacent to the second sidewall 142 of the dielectric body 140, a second distal side opposite the second proximal side, a second bottom surface, a second top surface opposite the second bottom surface, and second opposing ends adjacent to the second emitter/collector regions 121-122, respectively.

Base regions 135, 125 for the first and second transistors 130, 120 can then be formed in the base openings between the first and second emitter/collector regions 131-132, 121-122 (see process 1010, FIGS. 15-22). Specifically, a first base region 135 can be formed such that it incorporates the first semiconductor nanosheet(s) 112.1, a first base semiconductor layer 136 on the first semiconductor nanosheet(s) 112.1, and an additional first base semiconductor layer 137 (also referred to herein as an extrinsic first base semiconductor layer) on the first base semiconductor layer 136. Similarly, a second base region 125 can be formed such that it incorporates the second semiconductor nanosheet(s) 112.2, a second base semiconductor layer 126 on the second semiconductor nanosheet(s) 112.2, and an additional second base semiconductor layer 127 (also referred to herein as an extrinsic second base semiconductor layer 127) on the second base semiconductor layer 126. The base semiconductor layers 136, 126 can be made of the same semiconductor material as the semiconductor nanosheet(s) (e.g., Si). Alternatively, for heterojunction bipolar transistors (HBTs), this base semiconductor layers 136, 126 can be made of a semiconductor material that is different from that of the semiconductor nanosheets (e.g., SiGe). The additional base semiconductor layers 137, 127 can be made of the same semiconductor material as the semiconductor nanosheet(s) (e.g., Si), the same semiconductor material as the base semiconductor layers 136, 126, or a layer of some other suitable base semiconductor material.

If the first transistor 130 and the second transistor 120 are being formed as the same type of BJTs (e.g., both NPN-type BJTs or both PNP-type BJTs), the first base region 135 and the second base region 125 can be formed concurrently at process 1010. However, if the first transistor 130 and the second transistor 120 are different types of BJTs (e.g., a PNP-type BJT and an NPN-type BJT, respectively), then separate processing would be required, as illustrated in the figures.

For example, consider formation of a PNP-type first BJT 130 and an NPN-type second BJT 120. A conformal dielectric layer 161 can be formed over the partially completed structure (see FIG. 15). The conformal dielectric layer 161 can include, for example, a relatively thin conformal oxide layer and a relatively think conformal nitride layer on the oxide layer. A hardmask 162 (e.g., a spin-on carbon (SOC) hardmask) can be formed and patterned so that it covers one side of the partially completed structure, for example, the side with the second semiconductor nanosheet(s) (see FIG. 16). The exposed portion of the conformal dielectric layer 161 on the opposite side of the partially completed structure can then be selectively removed to expose the first semiconductor nanosheet(s) (see FIG. 17) and the hardmask 162 can be removed. The first base semiconductor layer 136 can be selectively grown on the exposed semiconductor surfaces of the first semiconductor body 105.1 and the first semiconductor nanosheet(s) 112.1 and in situ doped so as to have N-type conductivity (see FIG. 18). The additional first base semiconductor layer 137 can be selectively grown on the exposed semiconductor surfaces of the first base semiconductor layer 136 and also in situ doped so as to have the N-type conductivity but at a higher N-type conductivity level than that of the first base semiconductor layer 136 to complete the first base region 135 (see also FIG. 18). It should be noted that the first semiconductor nanosheet(s) 112.1 can be intrinsic (i.e., undoped). Alternatively, the first semiconductor nanosheet(s) 112.1 can also have N-type conductivity (e.g., at a relatively low conductivity level due to dopant diffusion from the layers formed thereon). Another conformal dielectric layer 164 (e.g., a conformal SiN layer) can be formed over the partially completed structure (see FIG. 19). Another hardmask 165 (e.g., another SOC hardmask) can be formed and patterned so that it covers the first base region 135 (see FIG. 20). The exposed portion of the conformal dielectric layer 164 and the remaining portion of the conformal dielectric layer 161 can then be selectively removed to expose the second semiconductor nanosheet(s) 112.2 (see FIG. 21) and the hardmask 165 can be removed. The second base semiconductor layer 126 can be selectively grown on the exposed semiconductor surfaces of the second semiconductor body 105.2 and the second semiconductor nanosheet(s) 112.2 and in situ doped so as to have P-type conductivity (see FIG. 22). The additional second base semiconductor layer 127 can be selectively grown on the exposed semiconductor surfaces of the second base semiconductor layer 126 and also in situ doped so as to have the P-type conductivity but at a higher P-type conductivity level than that of the second base semiconductor layer 126 to complete the second base region 125 (see also FIG. 22). It should be noted that the second semiconductor nanosheet(s) 112.2 can be intrinsic (i.e., undoped). Alternatively, the second semiconductor nanosheet(s) 112.2 can also have P-type conductivity (e.g., at a relatively low conductivity level due to dopant diffusion from the layers formed thereon). Then, the remaining portion of the conformal dielectric layer 164 can be removed.

Middle of the line (MOL) processing can then be performed (see process 1012 and FIGS. 1A-1D). Such MOL processing can include, but is not limited to, formation of metal silicide layers 174, formation of MOL dielectric layers (e.g., a second dielectric layer 192 including, for example, a relatively thin conformal etch stop layer and a blanket layer of SiO2 layer or some other suitable ILD material), and formation of MOL contacts 176 to the terminals of the first BJT 130 and the second BJT 120. Techniques for performing such MOL processing are well known in the art and, thus, the details thereof have been omitted from this specification in order to allow the reader to focus on the disclosed embodiments.

Figure 23:
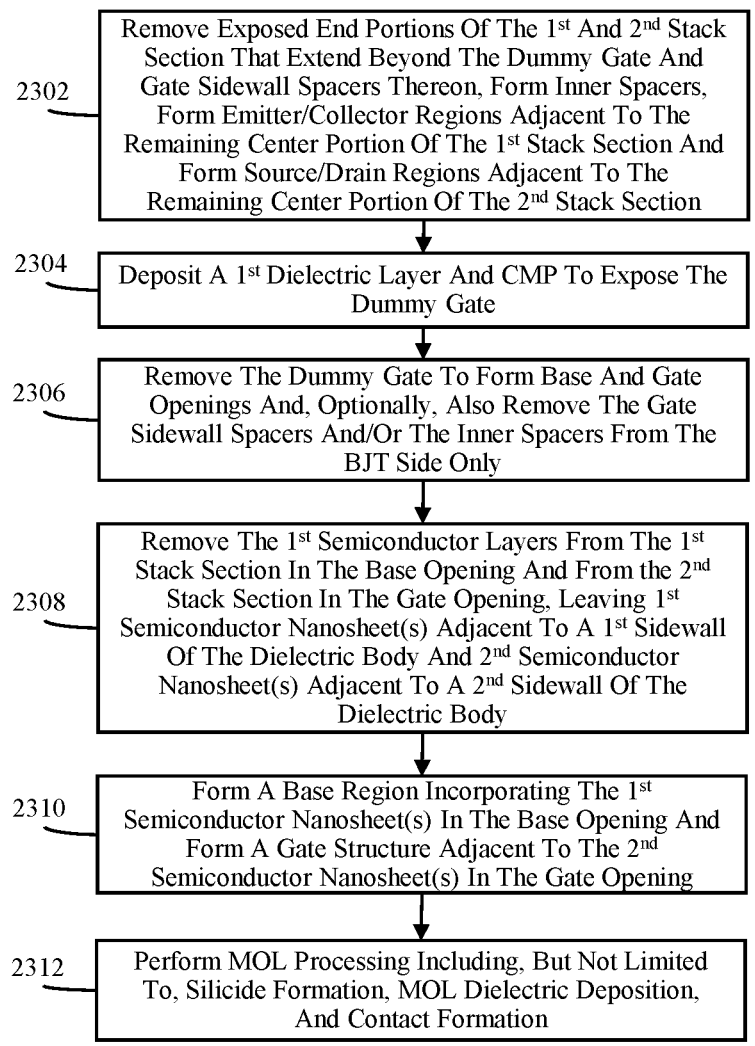
FIG. 23 is a flow diagram further illustrating process 310 of FIG. 3 with respect to the formation of the forksheet semiconductor structure of FIGS. 2A-2D.
Figure 24A:
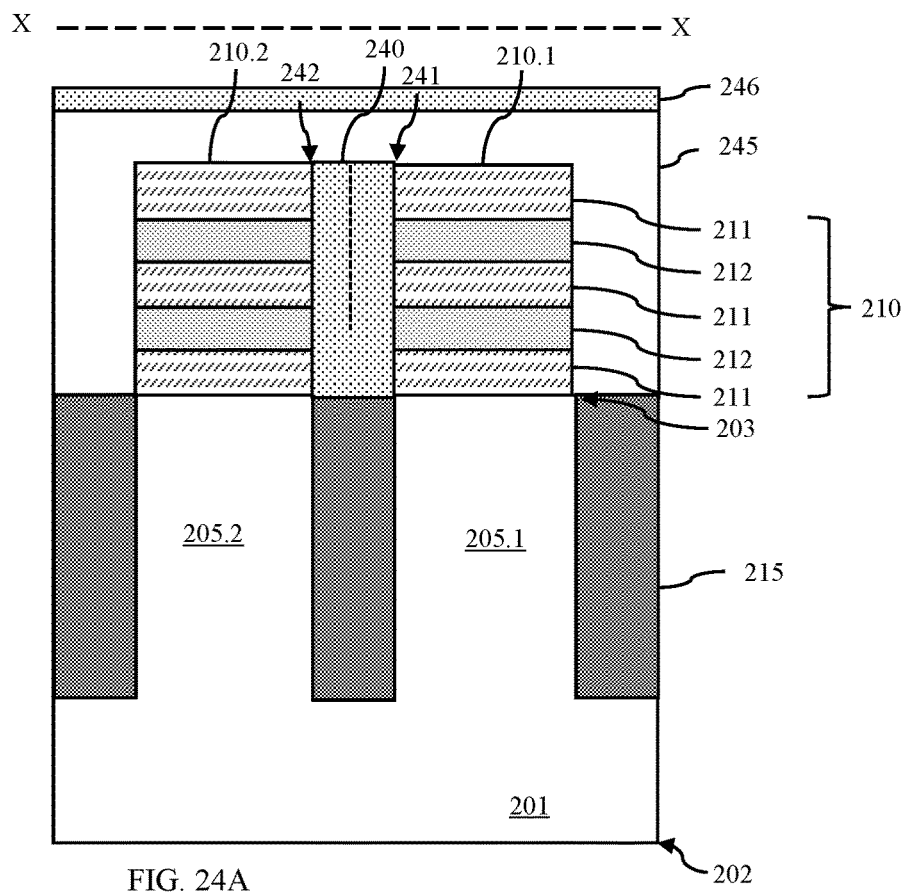
FIGS. 24A, 24C and 24D are different cross-section diagrams illustrating a partially completed semiconductor structure formed according to the flow diagram of FIG. 23
Figure 24B:
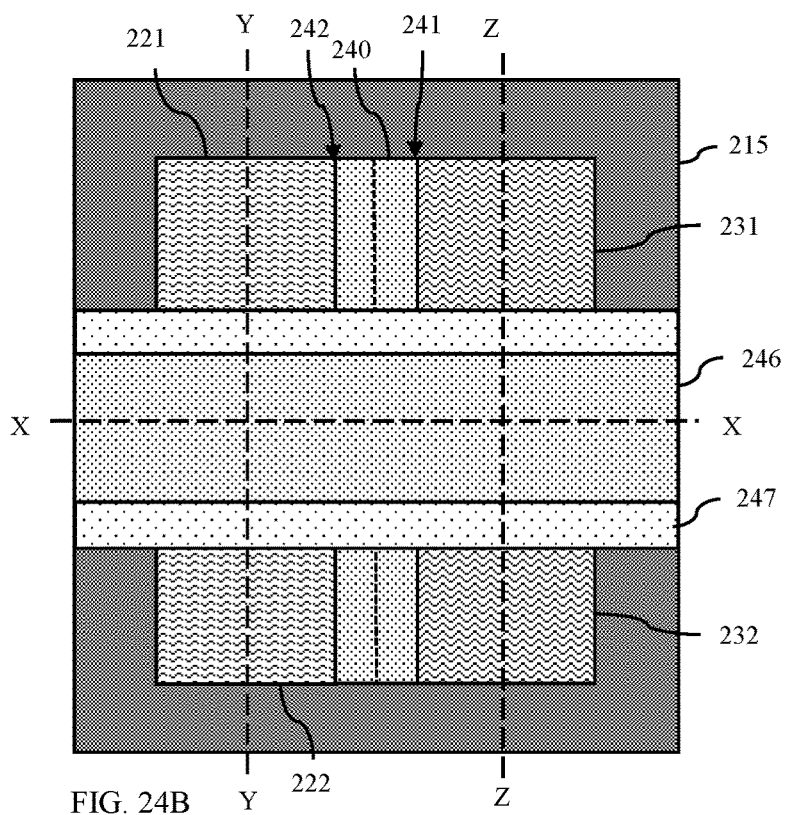
FIG. 24B is a top view diagram of the same structure.
Figure 24C:
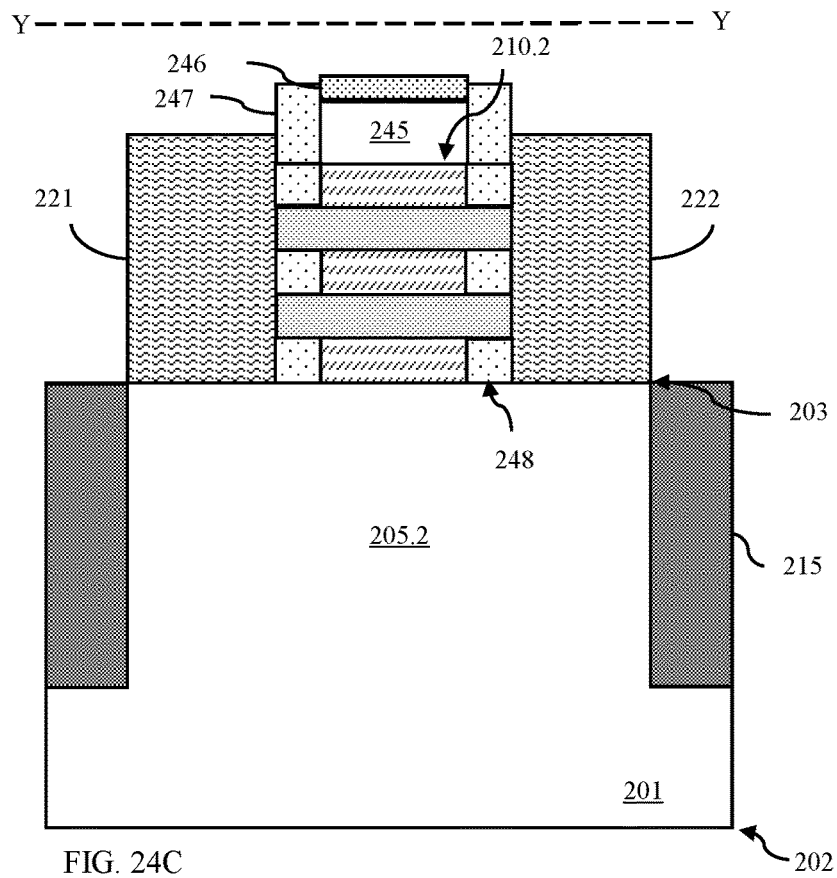
Figure 24D:
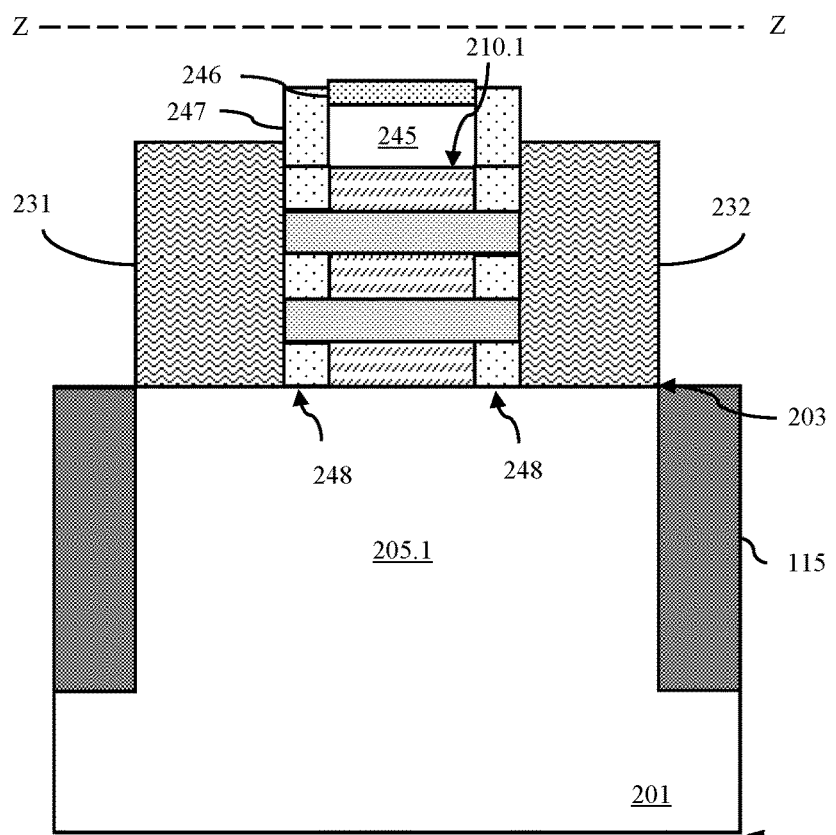

The flow diagram of FIG. 23 illustrates further illustrates process 310 and, particularly, exemplary processes that can be performed at process 310 of FIG. 3 in order to form the semiconductor structure 200 of FIGS. 2A-2D, where the first transistor 230 is a BJT and the second transistor 220 is a FET.

Emitter/collector regions 231-232 for the BJT 230 can be formed above the first semiconductor body 205.1 on both sides of the dummy gate 245 and source/drain regions 221-222 for the FET 220 can be formed above the second semiconductor body 205.2 on both sides of the dummy gate 245 (see process 2302 and FIGS. 24A-24D). For example, a selective anisotropic etch process could be performed in order to remove end portions of the first stack section 210.1 and end portions of the second stack section 210.2 that extend laterally beyond the dummy gate 245 and gate sidewall spacers 247 thereon. A selective lateral etch process could be performed in order to etch back exposed vertical surfaces of the first semiconductor layers 211 from the stack sections 210.1 and 210.2 and thereby form cavities. A conformal layer of spacer material (e.g., SiO2 or SiN) can be deposited so as to fill those cavities. A selective anisotropic etch process can be performed in order to remove this spacer material from outside the cavities, leaving the inner spacers 248 therein. Epitaxial semiconductor layers can then be selectively grown and in situ doped to form the emitter/collector regions 231-232 for the BJT 230 and the source/drain regions 221-222 for the FET 220.

For example, if the BJT 230 and the FET 220 are an NPN-type BJT and an NFET, respectively, or a PNP-type BJT and a PFET, respectively, then the epitaxial semiconductor layers can be concurrently grown. However, if the BJT 230 is a PNP-type BJT and the FET 220 is an NFET or vice versa, separate processing would be performed. For example, consider formation of a structure where the BJT 230 is a PNP-type BJT and the FET 220 is an NFET. A mask could be formed over the FET side of the partially completed structure, P+ emitter/collector regions 231-232 for the PNP-type BJT could be formed on opposing sides of the dummy gate adjacent to the first stack section 210.1, and the mask could be removed. Then, another mask could be formed over the BJT side of the partially completed structure, N+ source/drain regions 221-222 for the NFET could be formed on opposing sides of the dummy gate adjacent to the second stack section 210.1, and the mask could be removed.

Figure 25A:
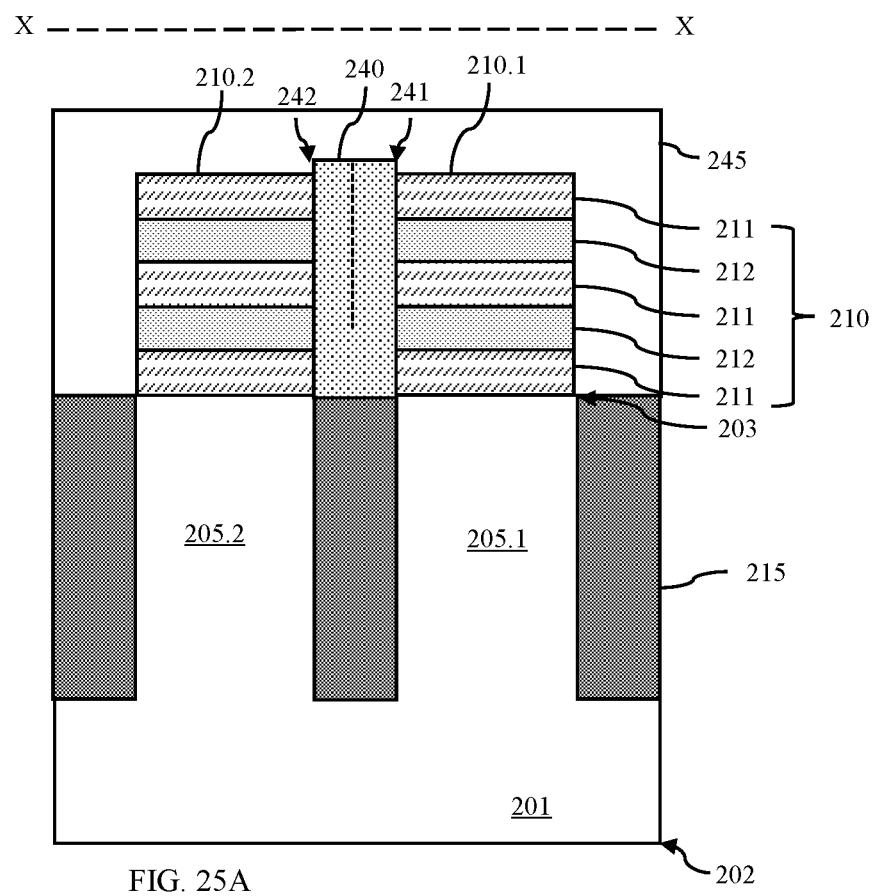
FIGS. 25A-25C are different cross-section diagrams illustrating a partially completed semiconductor structure formed according to the flow diagram of FIG. 23.
Figure 25B:
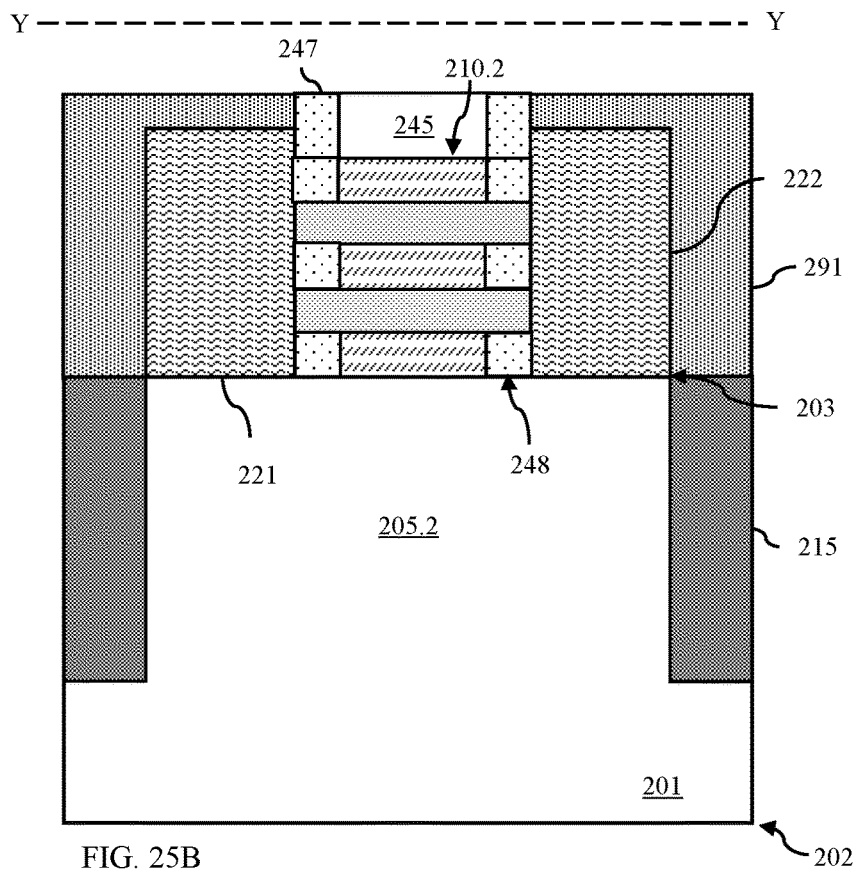
Figure 25C:
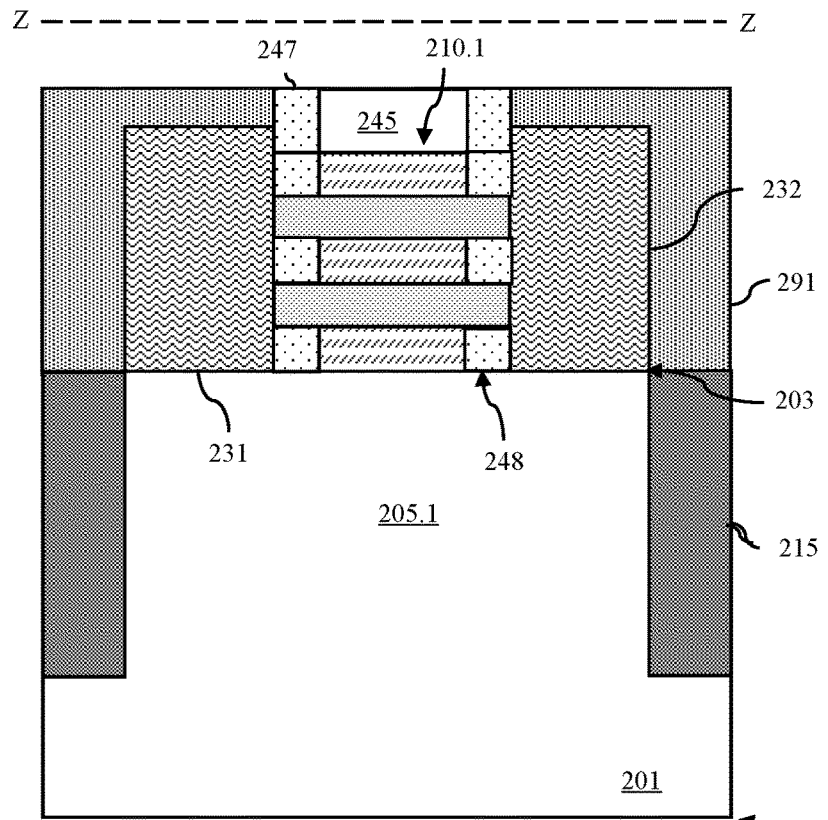
Figure 26A:
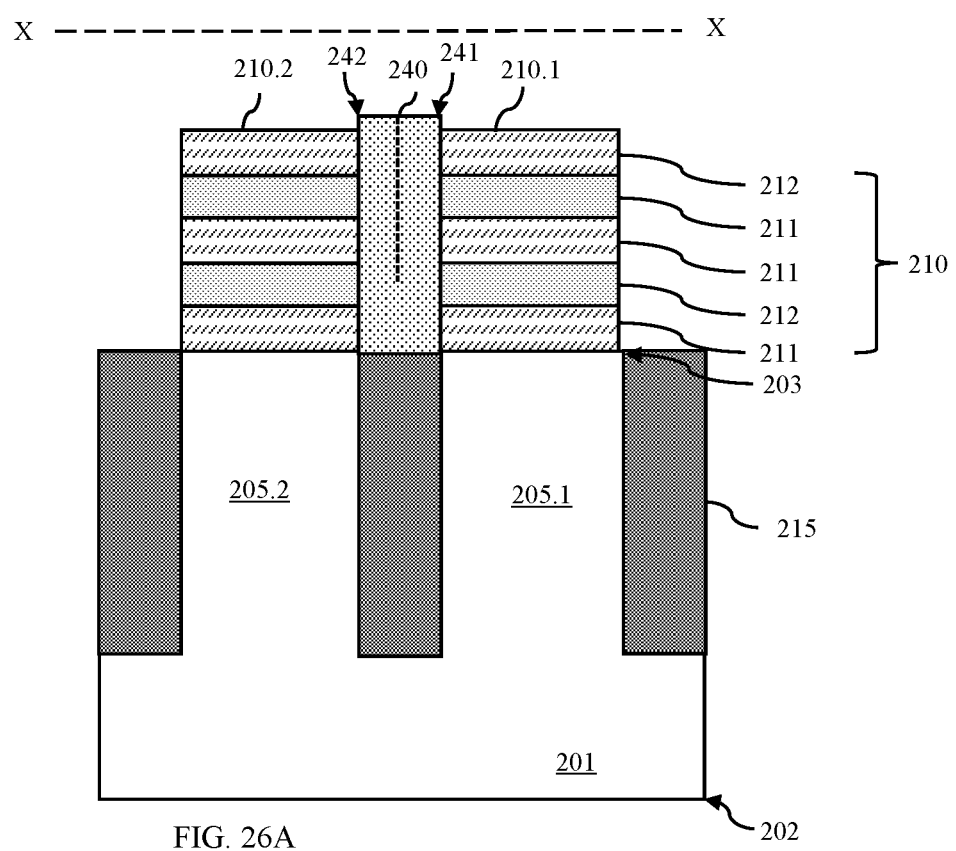
FIGS. 26A-26C are different cross-section diagrams illustrating a partially completed semiconductor structure formed according to the flow diagram of FIG. 23.
Figure 26B:
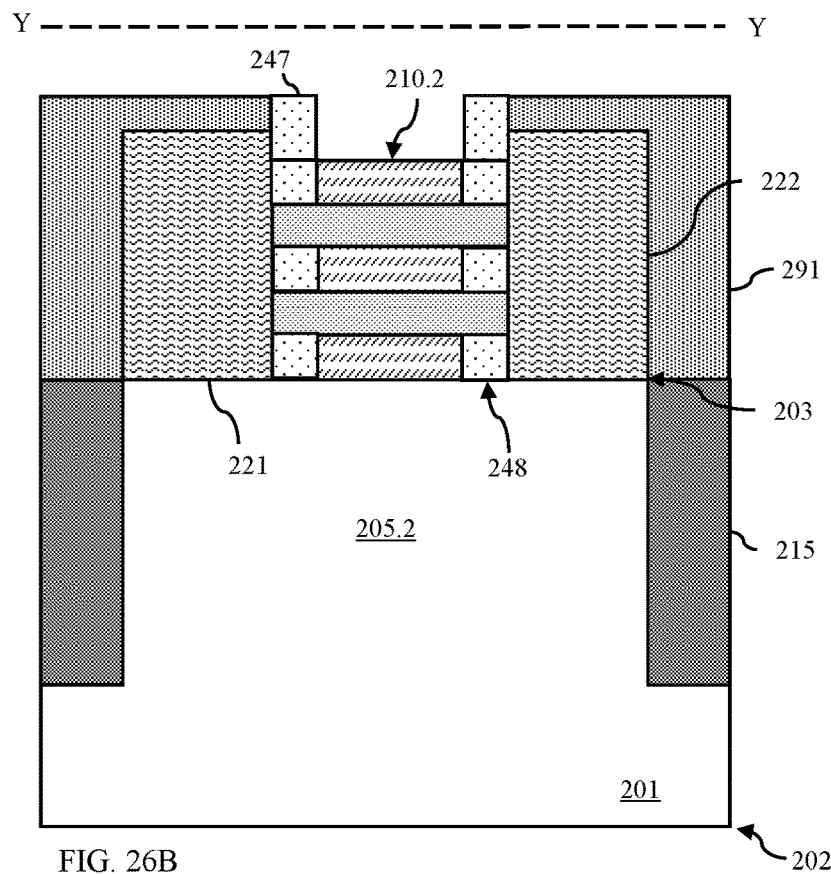
Figure 26C:
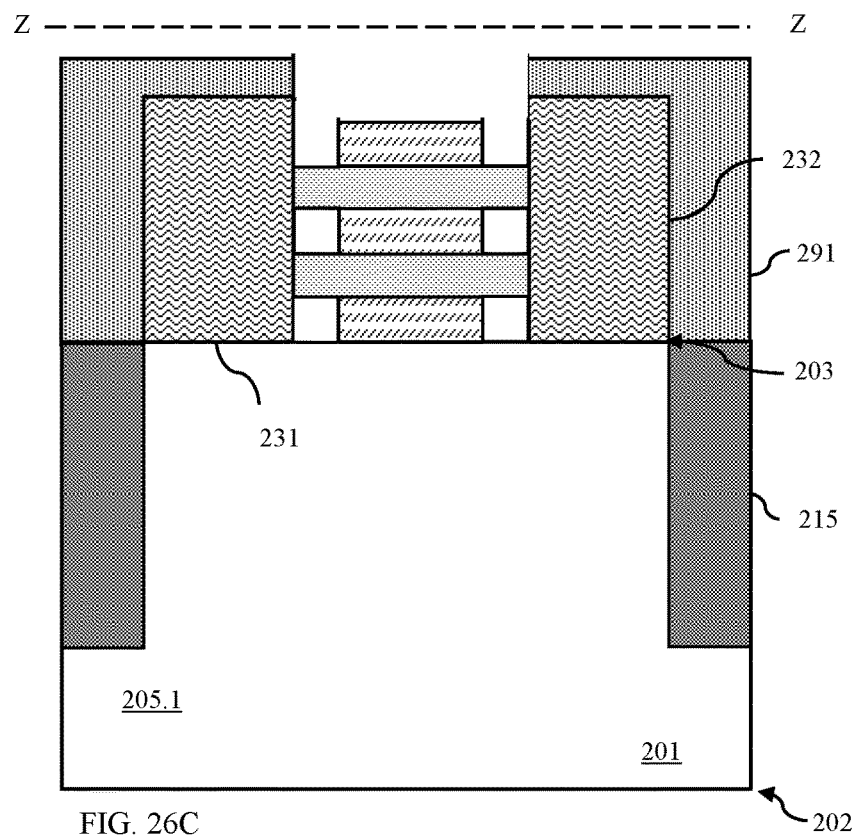

Next, a first dielectric layer 291 can be formed over the partially completed structure and a CMP process can be performed in order to remove the dielectric cap 246 and expose the top surface of the dummy gate 245 (see process 2304 and FIGS. 25A-25C). The first dielectric layer 291 can include one or more ILD material layers including, for example, at least one blanket ILD material layer made of a different dielectric material than the gate sidewall spacers 247 (e.g., a SiO2 layer or a blanket layer of some other suitable ILD material). Once exposed, the dummy gate 245 can be selectively removed in essentially the same manner as described above at process 1006, thereby creating a base opening on the BJT side of the dielectric body 240 and a gate opening on the FET side (see process 2306 and FIG. 26A-26C). Since electrical isolation of the emitter/collector regions 231-232 from the base region 235 is unnecessary, the gate sidewall spacers 247 and the inner spacers 248 on the BJT side (but not the FET side) can also be selectively removed (e.g., using a masked etch process).

Figure 27:
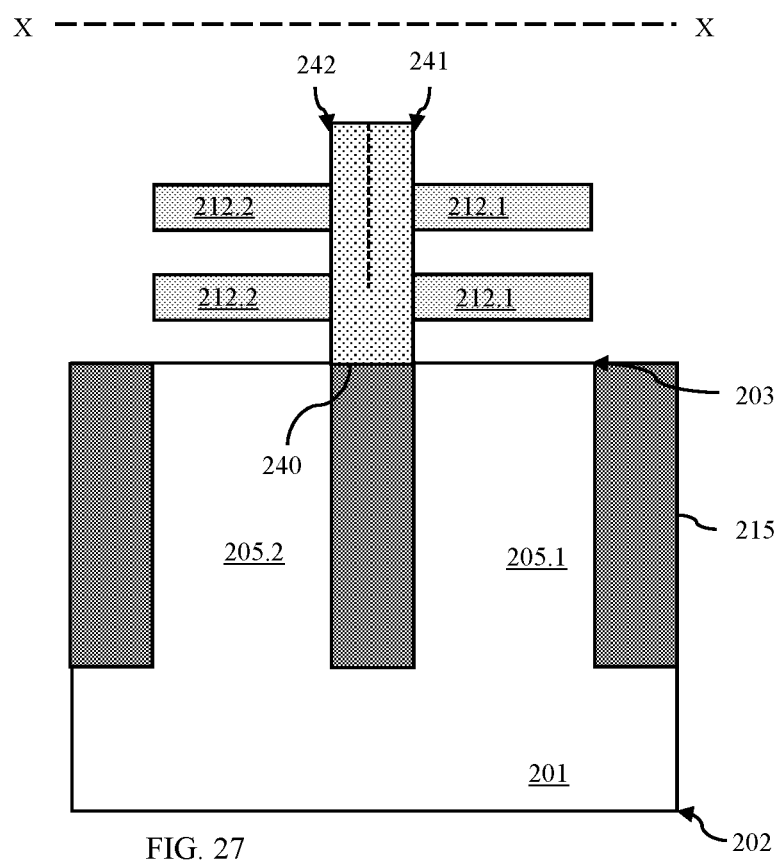
FIGS. 27-35 are cross-section diagram illustrating partially completed semiconductor structures, respectively, formed according to the flow diagram of FIG. 23.

The first semiconductor layers 211 (i.e., the sacrificial semiconductor layers) within the first stack section 210.1 exposed within the base opening and the second stack section 210.2 exposed within the gate opening can then be selectively removed in essentially the same manner as described above with regard to process 1008 (see process 2308 and FIG. 27). Thus, following process 2308, the partially completed structure will include one or more first semiconductor nanosheets 212.1 with each first semiconductor nanosheet having a first proximal side positioned laterally immediately adjacent to the first sidewall 241 of the dielectric body 240, a first distal side opposite the first proximal side, a first bottom surface, a first top surface opposite the first bottom surface, and first opposing ends adjacent to the emitter/collector regions 231-232. The partially completed structure will also include one or more second semiconductor nanosheets 212.2 with each second semiconductor nanosheet having a second proximal side positioned laterally immediately adjacent to the second sidewall 242 of the dielectric body 240, a second distal side opposite the second proximal side, a second bottom surface, a second top surface opposite the second bottom surface, and second opposing ends adjacent to the source/drain regions 221-222.

A base region 235 for the BJT 230 can be formed in the base opening and incorporating the first semiconductor nanosheet(s) 212.1 and a gate structure 225 for the FET 220 can be formed in the gate opening adjacent to the second semiconductor nanosheet(s) 212.2 (see process 2310, FIGS. 28-35).

Figure 28:
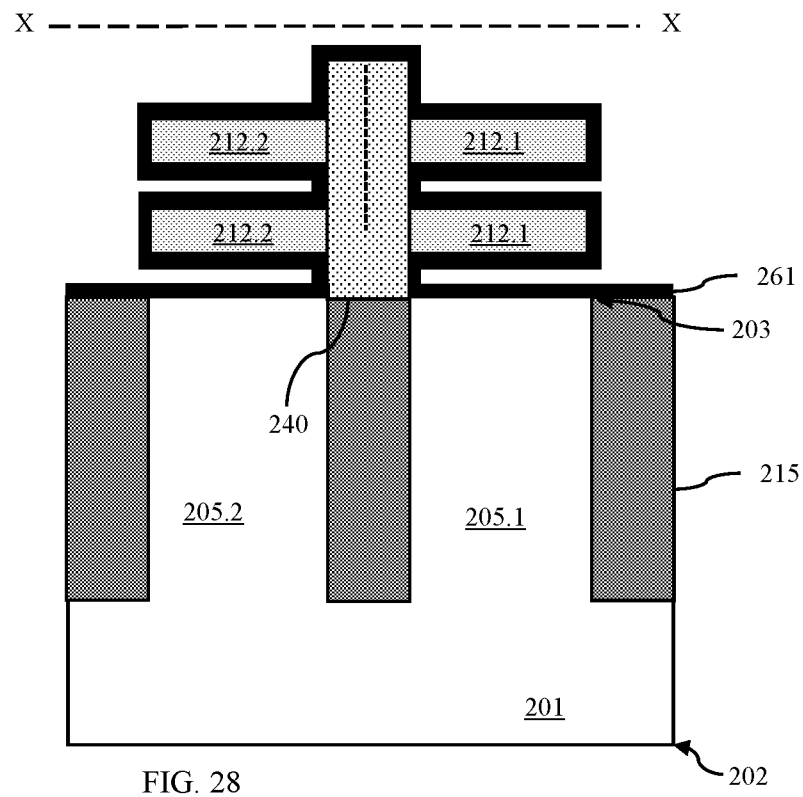
Figure 29:
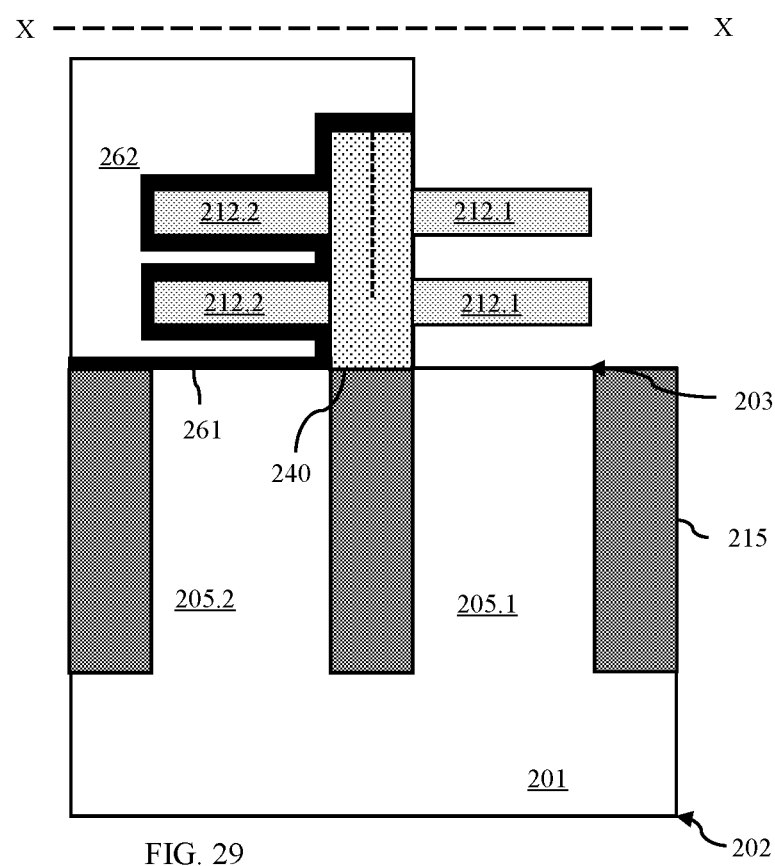
Figure 30:
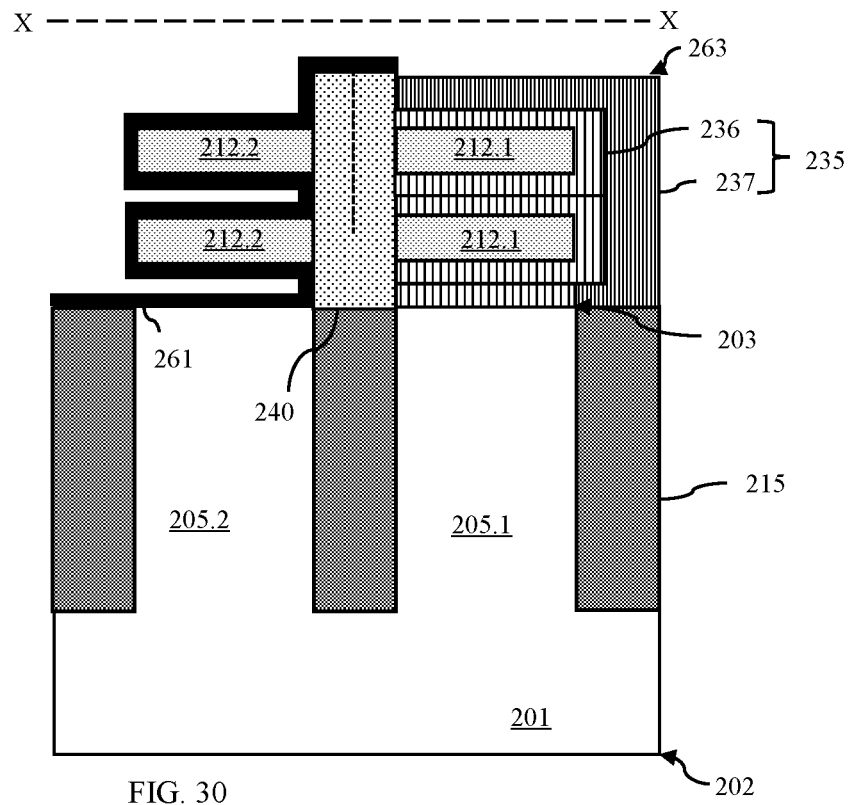
Figure 31:
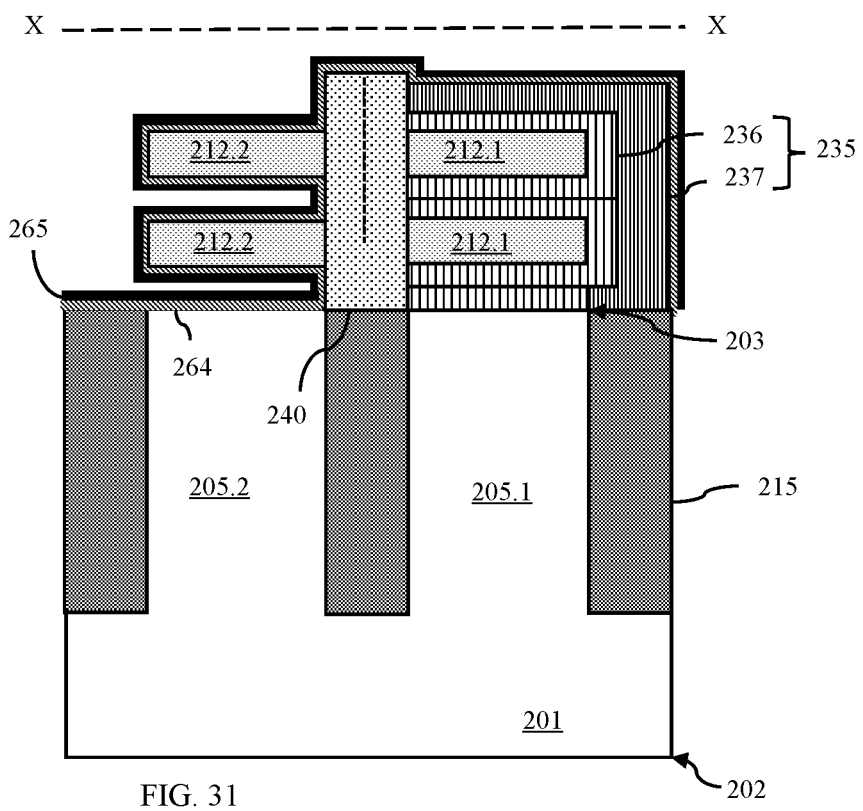
Figure 32:
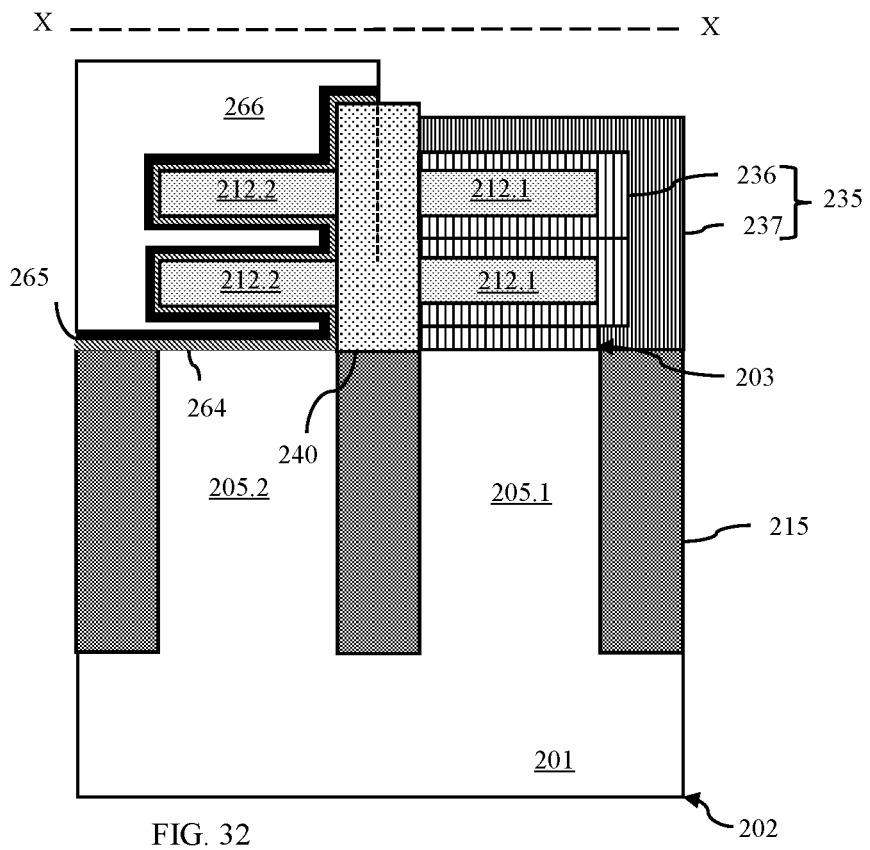
Figure 33:
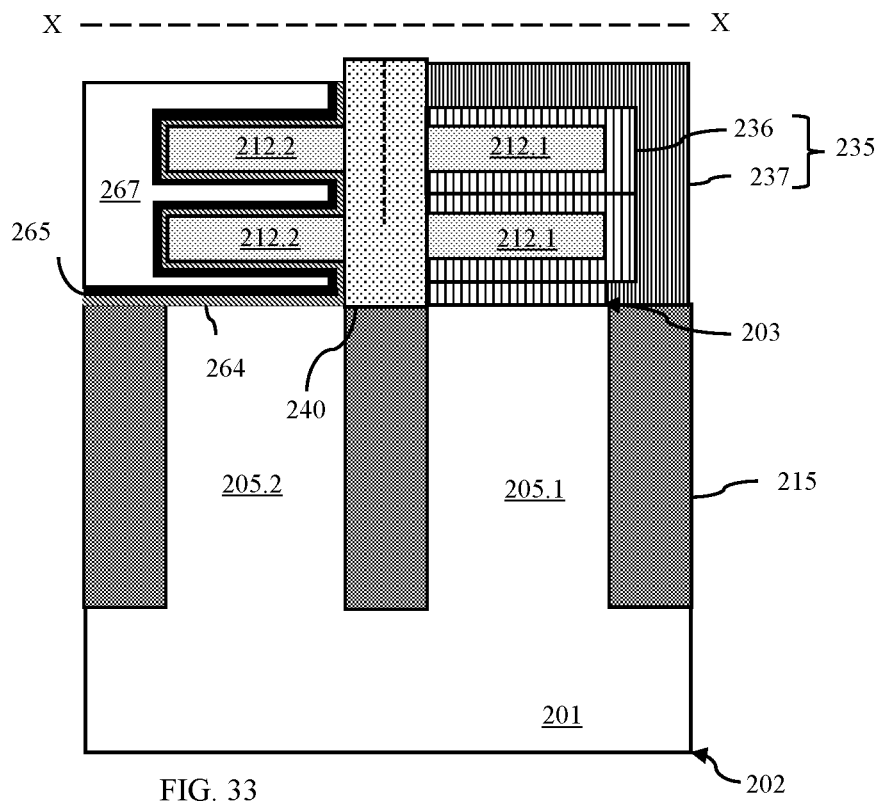
Figure 34:
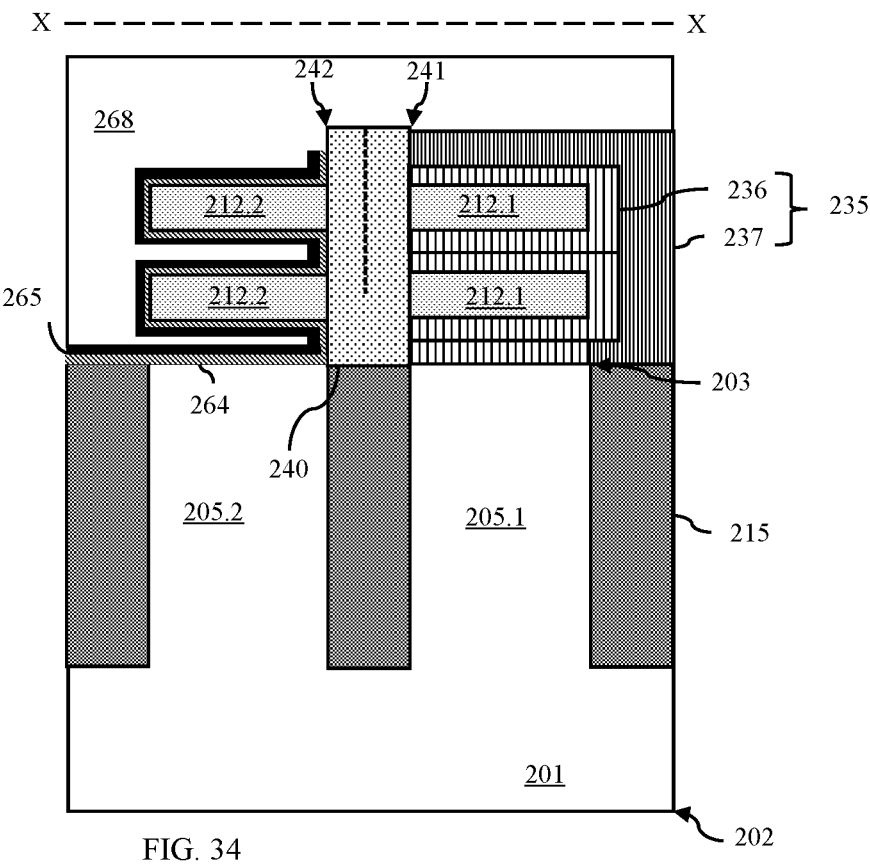
Figure 35:
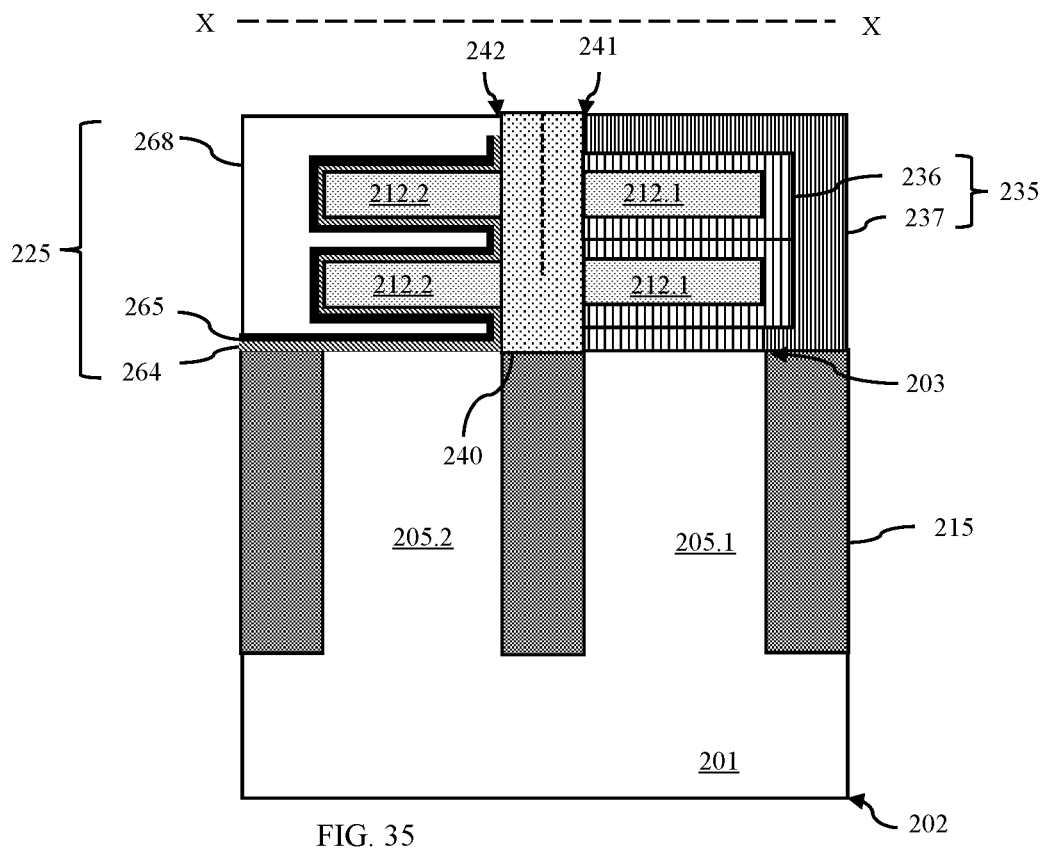

For example, a conformal dielectric layer 261 can be formed over the partially completed structure (see FIG. 28). The conformal dielectric layer 261 can include, for example, a relatively thin conformal oxide layer and a relatively think conformal nitride layer on the oxide layer. A hardmask 262 (e.g., a spin-on carbon (SOC) hardmask) can be formed and patterned so that it covers the FET side of the partially completed structure (see FIG. 29). The exposed portion of the conformal dielectric layer 261 on the BJT side of the partially completed structure can then be selectively removed to expose the first semiconductor nanosheet(s) 212.1 (see also FIG. 29). Then, the hardmask 162 can be removed. A base semiconductor layer 236 can be selectively grown on the exposed semiconductor surfaces of the first semiconductor body 205.1 and the first semiconductor nanosheet(s) 212.1 and in situ doped so as to have the appropriate type conductivity for the type of BJT being formed (e.g., N-type conductivity for a PNP-type BJT or P-type conductivity for an NPN-type BJT) (see FIG. 30). The additional base semiconductor layer 237 can be selectively grown on the exposed semiconductor surfaces of the base semiconductor layer 236 and also in situ doped so as to have the same type conductivity as the base semiconductor layer 236 at a higher conductivity level (e.g., N+ for a PNP-type BJT or P+ for an NPN-type BJT) (see also FIG. 30).

A gate dielectric layer can be formed over the partially completed structure. The gate dielectric layer can include one or more conformal gate dielectric layers. The conformal gate dielectric layers can include, for example, a first gate dielectric layer (e.g., an SiO2 layer) and a second gate dielectric layer 265 (e.g., a high-K gate dielectric layer) (see FIG. 31). Another hardmask 266 (e.g., another SOC hardmask) can be formed and patterned so that it covers the FET side of the partially completed structure, leaving the portions of the gate dielectric layer 264-265 over the base region 235 on the BJT side exposed (see FIG. 32). The exposed portions of the gate dielectric layers 264-265 can be selectively removed (see also FIG. 32). Then, the hardmask 266 can be removed. Yet another hardmask 267 can be formed and patterned on the FET side of the partially completed structure with a top surface below the level the top of the dielectric body 240 so that portions of the dielectric layers 264-265, which are on the top of the dielectric body 240 and which are also on the second sidewall 242 of the dielectric body 240 extending downward from the top toward the uppermost second semiconductor nanosheet 212.2, are exposed (see FIG. 33). The exposed portions of dielectric layers 264-265 can be selectively removed (see also FIG. 33). Then, the hardmask 267 can be removed. A gate conductor layer 268 can formed over the partially completed structure (see FIG. 34). The gate conductor layer 268 could be a work function metal layer, a doped polysilicon layer, and/or some other suitable gate conductor material layer. A CMP process can then be performed to remove all gate conductor material from the top of the dielectric body 240 and further from the additional base semiconductor layer 237 of the base region 235 of the BJT 230, thereby completing the gate structure 225 for the FET 230 (see FIG. 35). For a more detailed discussion of exemplary gate materials that could be used see the discussion of the structure embodiments above.

MOL processing can then be performed (see process 2312 and FIGS. 2A-2D). Such MOL processing can include, but is not limited to, formation of metal silicide layers 274, formation of MOL dielectric layers (e.g., a second dielectric layer 292 including, for example, a relatively thin conformal etch stop layer and a blanket layer of SiO2 layer or some other suitable ILD material), and formation of MOL contacts 276 to the terminals of the BJT 230 and the FET 220. Techniques for performing such MOL processing are well known in the art and, thus, the details thereof have been omitted from this specification in order to allow the reader to focus on the disclosed embodiments.

It should be understood that in the structures and method described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a dielectric body having a first sidewall and a second sidewall opposite the first sidewall;
    a first transistor comprising a first semiconductor nanosheet positioned laterally immediately adjacent to the first sidewall; and
    a second transistor comprising a second semiconductor nanosheet positioned laterally immediately adjacent to the second sidewall, wherein at least the first transistor comprises a bipolar junction transistor,
    wherein the first semiconductor nanosheet further has a first bottom surface, a first top surface opposite the first bottom surface, a first proximal side immediately adjacent to the first sidewall of the dielectric body, and a first distal side opposite the first proximal side, and
    wherein the first transistor comprises a base region comprising:
        the first semiconductor nanosheet; and
        a base semiconductor layer adjacent to the first bottom surface, the first distal side, and the first top surface.

2. The structure of claim 1,
    wherein the base region further comprises an additional base semiconductor layer on the base semiconductor layer,
    wherein the first transistor further comprises emitter/collector regions, and wherein the base region is positioned laterally between the emitter/collector regions.

3. The structure of claim 1, further comprising:
a dielectric layer on the first transistor and the second transistor and further extending over and immediately adjacent to the dielectric body; and
contacts extending through the dielectric layer to the first transistor and the second transistor.

4. The structure of claim 2, wherein the base semiconductor layer has a first-type conductivity, wherein the additional base semiconductor layer has the first-type conductivity at a higher first-type conductivity level than the base semiconductor layer, and wherein the emitter/collector regions have a second-type conductivity that is different from the first-type conductivity.

5. The structure of claim 4, wherein the first semiconductor nanosheet is any of an intrinsic semiconductor nanosheet and a first-type conductivity semiconductor nanosheet.

6. The structure of claim 1, wherein the second transistor comprises a field effect transistor.

7. The structure of claim 6,
wherein the second semiconductor nanosheet further has a second bottom surface, a second top surface opposite the second bottom surface, a second proximal side immediately adjacent to the second sidewall, and a second distal side opposite the second proximal side, and
wherein the field effect transistor comprises:
a channel region comprising the second semiconductor nanosheet;
a gate structure comprising:
a gate dielectric layer adjacent to the second bottom surface, the second distal side, and the second top surface; and
a gate conductor layer on the gate dielectric layer opposite the second bottom surface, the second distal side, and the second top surface; and
source/drain regions, wherein the second semiconductor nanosheet is positioned laterally between and immediately adjacent to the source/drain regions and wherein the gate conductor layer is electrically isolated from the source/drain regions.

8. The structure of claim 7, wherein the bipolar junction transistor and the field effect transistor comprise one:
a PNP-type bipolar junction transistor and a P-type field effect transistor;
a PNP-type bipolar junction transistor and an N-type field effect transistor;
an NPN-type bipolar junction transistor and a P-type field effect transistor; and
an NPN-type bipolar junction transistor and an N-type field effect transistor.

9. A structure comprising:
a dielectric body having a first sidewall and a second sidewall opposite the first sidewall;
a first bipolar junction transistor comprising a first semiconductor nanosheet positioned laterally immediately adjacent to the first sidewall; and
a second bipolar junction transistor comprising a second semiconductor nanosheet positioned laterally immediately adjacent to the second sidewall,
wherein the first semiconductor nanosheet further has a first bottom surface, a first top surface opposite the first bottom surface, a first proximal side immediately adjacent to the first sidewall, and a first distal side opposite the first proximal side,
wherein the first bipolar junction transistor comprises a first base region comprising:
the first semiconductor nanosheet; and
a first base semiconductor layer adjacent to the first bottom surface, the first distal side, and the first top surface,
wherein the second semiconductor nanosheet further has a second bottom surface, a second top surface opposite the second bottom surface, a second proximal side immediately adjacent to the second sidewall, and a second distal side opposite the second proximal side, and
wherein the second bipolar junction transistor comprises a second base region comprising:
the second semiconductor nanosheet; and
a second base semiconductor layer adjacent to the second bottom surface, the second distal side, and the second top surface.

10. The structure of claim 9, further comprising:
a semiconductor substrate; and
an isolation region in the semiconductor substrate,
wherein the dielectric body is above and immediately adjacent to the isolation region,
wherein the isolation region is positioned laterally between a first semiconductor body and a second semiconductor body in an upper portion of the semiconductor substrate,
wherein the first semiconductor nanosheet is aligned above and physically separated from the first semiconductor body, and
wherein the second semiconductor nanosheet is aligned above and physically separated from the second semiconductor body.

11. The structure of claim 9,
wherein the first base region further comprises an additional first base semiconductor layer on the first base semiconductor layer,
wherein the first bipolar junction transistor further comprises first emitter/collector regions,
wherein the first base region is positioned laterally between the first emitter/collector regions,
wherein the second base region further comprises an additional second base semiconductor layer on the second base semiconductor layer, and
wherein the second bipolar junction transistor further comprises second emitter/collector regions, wherein the second base region is positioned laterally between the second emitter/collector regions.

12. The structure of claim 9, wherein the first bipolar junction transistor and the second bipolar junction transistor comprise NPN-type bipolar junction transistors.

13. The structure of claim 9, wherein the first bipolar junction transistor and the second bipolar junction transistor comprise PNP-type bipolar junction transistors.

14. The structure of claim 9, wherein the first bipolar junction transistor comprises a PNP-type bipolar junction transistor and the second bipolar junction transistor comprises an NPN-type bipolar junction transistor.

15. The structure of claim 9, further comprising:
a dielectric layer on the first bipolar junction transistor and the second bipolar junction transistor and further extending laterally over and immediately adjacent to the dielectric body electrically isolating the first bipolar junction transistor from the second bipolar junction transistor; and contacts extending through the dielectric layer to the first bipolar junction transistor and the second bipolar junction transistor.

16. A method comprising:
forming a first transistor comprising a first semiconductor nanosheet positioned laterally immediately adjacent to a first sidewall of a dielectric body; and
forming a second transistor comprising a second semiconductor nanosheet positioned laterally immediately adjacent to a second sidewall of the dielectric body opposite the first sidewall,
wherein the forming of the first transistor comprises forming a bipolar junction transistor,
wherein the first semiconductor nanosheet further has a first bottom surface, a first top surface opposite the first bottom surface, a first proximal side immediately adjacent to the first sidewall of the dielectric body, and a first distal side opposite the first proximal side, and
wherein the first transistor comprises a base region comprising:
the first semiconductor nanosheet; and
a base semiconductor layer adjacent to the first bottom surface, the first distal side, and the first top surface.

17. The method of claim 16, wherein the forming of the second transistor comprises forming a second bipolar junction transistor.

18. The method of claim 17, wherein the first transistor and the second transistor are formed so as to comprise one of:
two PNP-type bipolar junction transistors;
two NPN-type bipolar junction transistors; and
a PNP-type bipolar junction transistor and an NPN-type bipolar junction transistor.

19. The method of claim 16, wherein the forming of the second transistor comprises forming a field effect transistor.

20. The method of claim 19, wherein the first transistor and the second transistor are formed so as to comprise one of:
a PNP-type bipolar junction transistor and a P-type field effect transistor;
a PNP-type bipolar junction transistor and an N-type field effect transistor;
an NPN-type bipolar junction transistor and a P-type field effect transistor; and
an NPN-type bipolar junction transistor and an N-type field effect transistor.

* * * * *